(12) United States Patent
Lu et al.

(10) Patent No.: US 11,335,672 B2
(45) Date of Patent: *May 17, 2022

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Hsiang-Tai Lu, Hsinchu County (TW); Shuo-Mao Chen, New Taipei (TW); Mill-Jer Wang, Hsinchu (TW); Feng-Cheng Hsu, New Taipei (TW); Chao-Hsiang Yang, Hsinchu (TW); Shin-Puu Jeng, Hsinchu (TW); Cheng-Yi Hong, Hsinchu (TW); Chih-Hsien Lin, Tai-Chung (TW); Dai-Jang Chen, New Taipei (TW); Chen-Hua Lin, Yunlin County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/937,343

(22) Filed: Jul. 23, 2020

(65) Prior Publication Data
US 2020/0357785 A1    Nov. 12, 2020

Related U.S. Application Data

(62) Division of application No. 15/725,766, filed on Oct. 5, 2017, now Pat. No. 10,741,537.
(Continued)

(51) Int. Cl.
*H01L 25/00*   (2006.01)
*H01L 23/538*  (2006.01)
(Continued)

(52) U.S. Cl.
CPC .......... *H01L 25/50* (2013.01); *H01L 21/486* (2013.01); *H01L 21/4853* (2013.01);
(Continued)

(58) Field of Classification Search
CPC ... H01L 25/50; H01L 25/043; H01L 25/0657; H01L 25/074; H01L 25/0756; H01L 25/117; H01L 22/32; H01L 22/14
See application file for complete search history.

(56) References Cited

U.S. PATENT DOCUMENTS 10,741,537 B2 *   8/2020   Lu ..................... H01L 23/3185

FOREIGN PATENT DOCUMENTS

| CN | 102214615 A | 10/2011 |
| CN | 105405827 A | 3/2016 |

OTHER PUBLICATIONS

Office Action and Search Report from CNIPA dated Sep. 7, 2020 for related CN application 201711240557.2.

* cited by examiner

*Primary Examiner* — David A Zarneke
(74) *Attorney, Agent, or Firm* — WPAT, P.C., Intellectual Property Attorneys; Anthony King

(57) ABSTRACT

A method of manufacturing a semiconductor structure forming a redistribution layer (RDL); forming a conductive pad over the RDL; performing a first electrical test through the conductive pad; bonding a first die over the RDL by a connector; disposing a first underfill material to surround the connector; performing a second electrical test through the conductive pad; disposing a second die over the first die and the conductive pad; and disposing a second underfill material to surround the second die, wherein the conductive pad is at least partially in contact with the second underfill
(Continued)

material, and is protruded from the RDL during the first electrical test and the second electrical test.

20 Claims, 26 Drawing Sheets

Related U.S. Application Data

(60) Provisional application No. 62/447,633, filed on Jan. 18, 2017.

(51) Int. Cl.
  *H01L 23/31* (2006.01)
  *H01L 23/00* (2006.01)
  *H01L 25/10* (2006.01)
  *H01L 21/48* (2006.01)
  *H01L 21/56* (2006.01)
  *H01L 21/66* (2006.01)
  *H01L 23/498* (2006.01)
  *H01L 23/522* (2006.01)
  *H01L 23/053* (2006.01)

(52) U.S. Cl.
  CPC ............ *H01L 21/565* (2013.01); *H01L 22/20* (2013.01); *H01L 22/32* (2013.01); *H01L 23/3135* (2013.01); *H01L 23/3185* (2013.01); *H01L 23/5386* (2013.01); *H01L 24/19* (2013.01); *H01L 24/20* (2013.01); *H01L 25/105* (2013.01); *H01L 21/4857* (2013.01); *H01L 21/563* (2013.01); *H01L 22/14* (2013.01); *H01L 23/053* (2013.01); *H01L 23/3128* (2013.01); *H01L 23/49827* (2013.01); *H01L 23/49838* (2013.01); *H01L 23/5226* (2013.01); *H01L 23/5383* (2013.01); *H01L 23/5384* (2013.01); *H01L 23/5389* (2013.01); *H01L 23/562* (2013.01); *H01L 24/23* (2013.01); *H01L 24/24* (2013.01); *H01L 2224/02379* (2013.01); *H01L 2224/16225* (2013.01); *H01L 2224/214* (2013.01); *H01L 2224/32225* (2013.01); *H01L 2224/73204* (2013.01); *H01L 2225/1035* (2013.01); *H01L 2225/1058* (2013.01); *H01L 2924/15311* (2013.01); *H01L 2924/18161* (2013.01); *H01L 2924/3511* (2013.01); *Y02P 80/30* (2015.11)

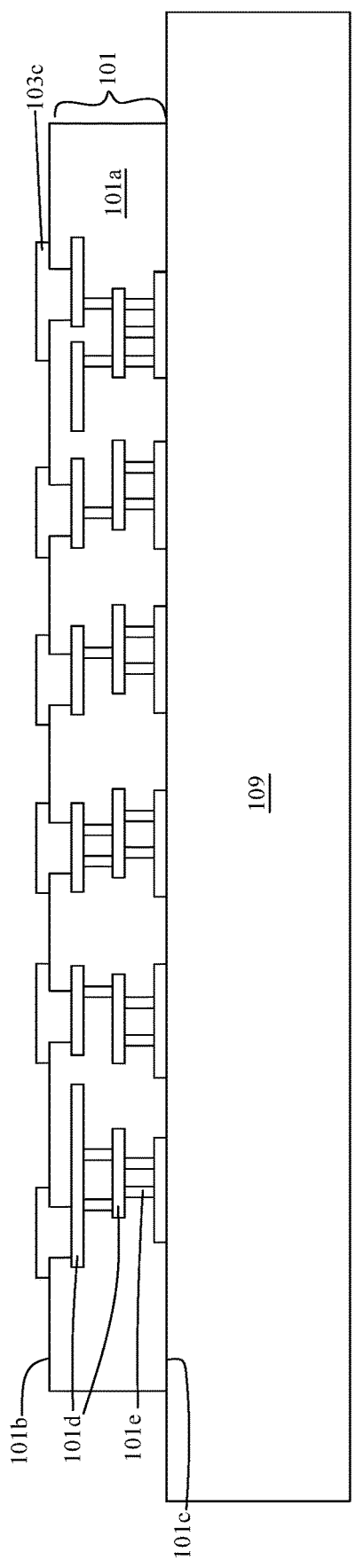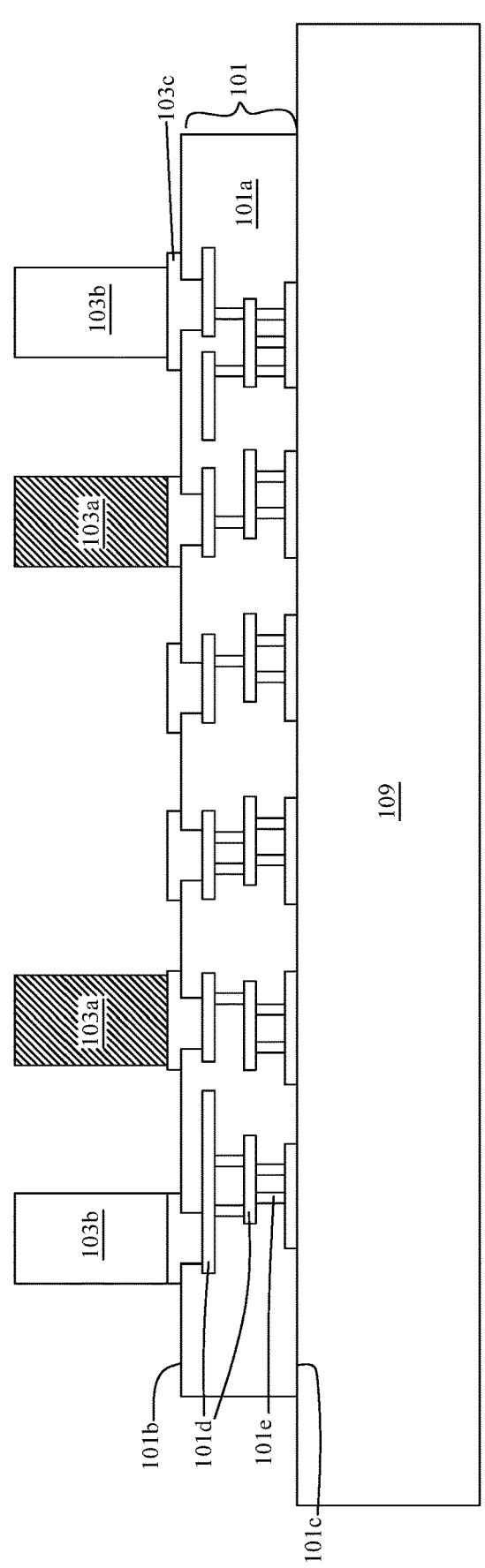
FIG. 9A
FIG. 9B

SEMICONDUCTOR STRUCTURE AND MANUFACTURING METHOD THEREOF

PRIORITY CLAIM AND CROSS-REFERENCE

This application is a divisional application of U.S. Non-Provisional application Ser. No. 15/725,766 filed on Oct. 5, 2017 entitled "Semiconductor Structure and Manufacturing Method Thereof," which is hereby incorporated herein by reference.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, delamination of components, or other issues, resulting in a high yield loss of the semiconductor device. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 9A-9J are schematic views of manufacturing a semiconductor structure by a method of FIG. 9 in accordance with some embodiments of the present disclosure.

DETAILED DESCRIPTION OF THE DISCLOSURE

Figure 1:
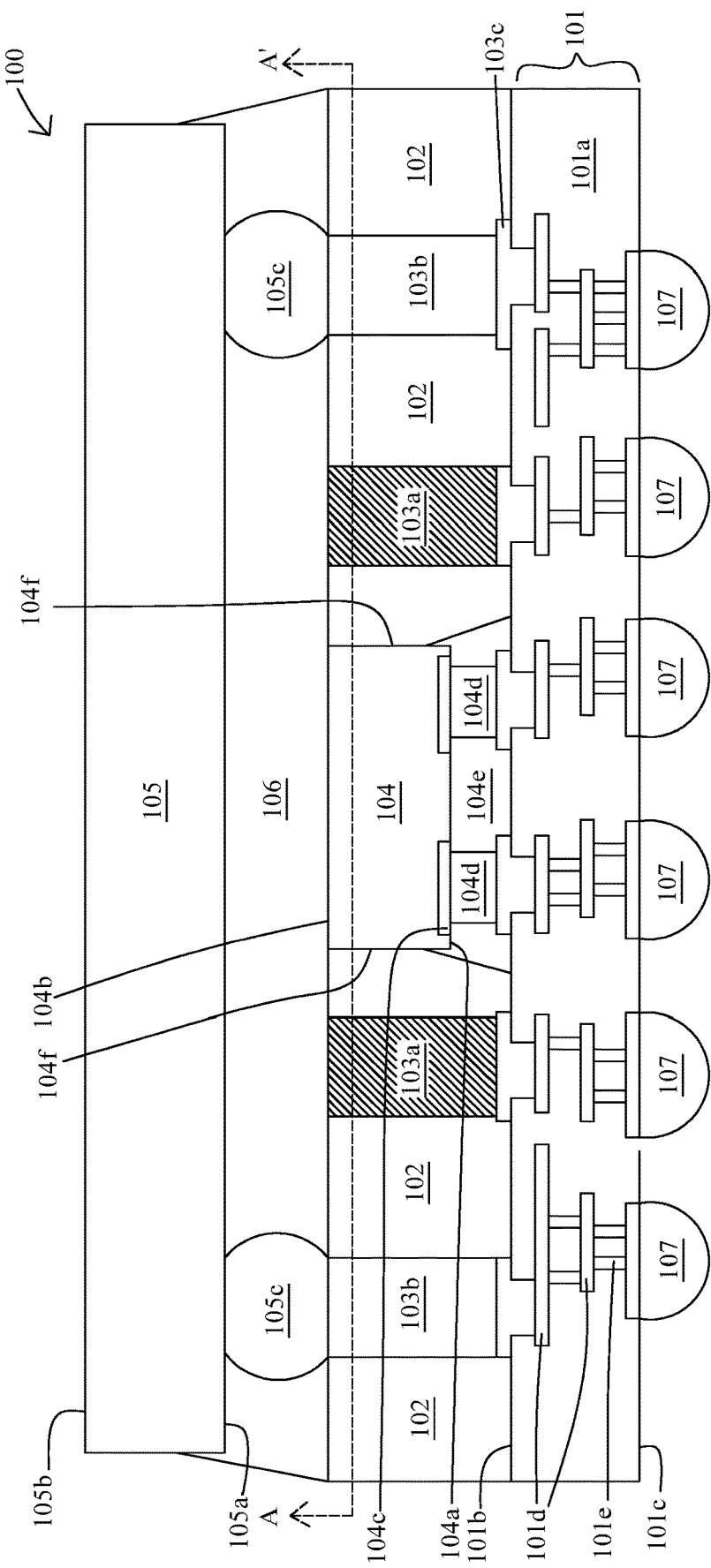
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A die is fabricated and singulated from a semiconductive wafer. After singulation, the die is packaged to become a semiconductor package and integrated with another die or package. The die is encapsulated by a molding, and I/O terminals of the die are routed out through conductive lines disposed within a dielectric layer, and the die is electrically connected to another dies or packages by a via extending through the molding or a connector between the dies or packages. However, such configuration may not be feasible for identifying failure of dies or electrical interconnections at an earlier manufacturing stage or before completion of the manufacturing. For example, an electrical testing can only be performed when the package is completed.

In the present disclosure, a semiconductor structure is disclosed. The semiconductor structure includes a dummy conductive member for electrical testing during the manufacturing of the semiconductor structure. The dummy conductive member is formed during the manufacturing, and a die or an electrical interconnection in the semiconductor structure can be tested through the dummy conductive member during the manufacturing or before the completion of the semiconductor structure. As such, failure of die or electrical interconnection can be identified at an earlier manufacturing stage. Therefore, wastage of material can be minimized and a yield of the semiconductor structure can be increased or improved.

FIG. 1 is a schematic cross sectional view of a semiconductor structure 100 in accordance with various embodiments of the present disclosure. In some embodiments, the semiconductor structure 100 includes a redistribution layer (RDL) 101, a molding 102, conductive members 103, a first die 104, a second die 105, an second underfill material 106 and a conductive bump 107.

In some embodiments, the semiconductor structure 100 is a semiconductor package. In some embodiments, the semiconductor structure 100 is an integrated fan out (InFO) package, where I/O terminals of the first die 104 or the second die 105 are fanned out and redistributed over a surface of the first die 104 or the second die 105 in a greater area. In some embodiments, the semiconductor structure 100 is a package on package (PoP), that dies or packages are stacked over each other.

In some embodiments, the RDL 101 re-routes a path from the first die 104 or the second die 105 so as to redistribute I/O terminals of the first die 104 or the second die 105 over the molding 102. In some embodiments, the RDL 101 is a post passivation interconnection (PPI). In some embodiments, the RDL 101 includes a first side 101b and a second side 101c opposite to the first side 101b. In some embodiments, the RDL 101 includes one or more dielectric layers 101a and one or more conductive traces (101d and 101e) disposed within and surrounded by the dielectric layer(s) 101a.

In some embodiments, the dielectric layer 101a includes dielectric material such as silicon oxide, silicon nitride, silicon carbide, silicon oxynitride, polymer, polybenzoxazole (PBO), polyimide, benzocyclobutene (BCB), or the like. In some embodiments, the conductive traces (101d and 101e) includes conductive material such as gold, silver, copper, nickel, tungsten, aluminum, palladium and/or alloys thereof.

In some embodiments, the conductive trace includes a land portion 101d and a via portion 101e disposed within the dielectric layer 101a. In some embodiments, the land portion 101d is laterally extended in the dielectric layer 101a. In some embodiments, the land portion 101d is electrically coupled with the via portion 101e. In some embodiments, the land portion 101d is disposed over the second side 101c of the dielectric layer 101. In some embodiments, the land portion 101d is configured to receive or couple with external conductive structure. In some embodiments, the via portion 101e is protruded from the land portion 101d. In some embodiments, the via portion 101e is vertically extended between the first side 101b and the second side 101c of the dielectric layer 101a. In some embodiments, the via portion 101e is disposed or extended between two of the land portions 101d.

In some embodiments, the molding 102 is disposed over the RDL 101. In some embodiments, the molding 102 is disposed over the dielectric layer 101a. In some embodiments, the molding 102 is disposed over the first side 101b of the dielectric layer 101a. In some embodiments, the molding 102 is in contact with the dielectric layer 101a. In some embodiments, the molding 102 can be a single layer film or a composite stack. In some embodiments, the molding 102 includes various materials, such as molding compound, molding underfill, epoxy, resin, or the like. In some embodiments, the molding 102 has a high thermal conductivity, a low moisture absorption rate and a high flexural strength.

In some embodiments, conductive members (103a, 103b or 103c) are disposed over or surrounded by the dielectric layer 101a. In some embodiments, In some embodiments, the conductive members (103a, 103b or 103c) includes conductive material such as gold, silver, copper, nickel, tungsten, aluminum, palladium and/or alloys thereof. In some embodiments, the conductive members (103a, 103b or 103c) are electrically connected to the conductive traces (101d and 101e). In some embodiments, each of the conductive members (103a, 103b or 103c) can be in different configurations or shapes such as a pillar, a post, a bond pad, etc.

In some embodiments, the conductive members (103a, 103b or 103c) includes a first conductive member 103a, a second conductive member 103b and a third conductive member 103c. In some embodiments, the first conductive member 103a is disposed over the RDL 101 and electrically connected to the conductive traces (101d and 101e). In some embodiments, the first conductive member 103a is disposed within or surrounded by the molding 102. In some embodiments, the first conductive member 103a is electrically coupled with the land portion 10d. In some embodiments, the first conductive member 103a is directly contacted with the land portion 101d. In some embodiments, the first conductive member 103a is extended from the land portion 101d. In some embodiments, the first conductive member 103a is extended through the molding 102. In some embodiments, the first conductive member 103a is a dummy conductive member. In some embodiments, the first conductive member 103a is served as a testing terminal for testing the first die 104 or an interconnection of the conductive trace (101d, 101e). In some embodiments, the first conductive member 103a is a via, a pillar, a post, a connector or the like. In some embodiments, the first conductive member 103a is a through integrated fan out via (TIV) or through molding via (TMV).

In some embodiments, the second conductive member 103b is disposed over the RDL 101 and electrically connected to the conductive traces (101d and 101e). In some embodiments, the second conductive member 103b is disposed within or surrounded by the molding 102. In some embodiments, the second conductive member 103b is electrically coupled with the land portion 101d. In some embodiments, the second conductive member 103b is directly contacted with the land portion 101d. In some embodiments, the second conductive member 103b is extended from the land portion 101d. In some embodiments, the second conductive member 103b is extended through the molding 102. In some embodiments, the first conductive member 103a is disposed between the first die 104 and the second conductive member 103b. In some embodiments, the second conductive member 103b is a via, a pillar, a post, a connector or the like. In some embodiments, the second conductive member 103b is a through integrated fan out via (TIV) or through molding via (TMV). In some embodiments, the second conductive member 103b has similar configuration as the first conductive member 103a.

In some embodiments, the third conductive member 103c is disposed over or partially surrounded by the dielectric layer 101a. In some embodiments, the third conductive member 103c is partially surrounded by the molding 102. In some embodiments, the third conductive member 103c is surrounded by the dielectric layer 101a and the molding 102. In some embodiments, the third conductive member 103c is electrically connected to the conductive traces (101d and 101e). In some embodiments, the third conductive member 103c is electrically coupled with the land portion 101d. In some embodiments, the third conductive member 103c is extended from the molding 102 to the dielectric layer 101a. In some embodiments, the third conductive member 103c is a pad, a bond pad or the like.

In some embodiments, the third conductive member 103c is extended between the land portion 101d and the first conductive member 103a or the second conductive member 103b. In some embodiments, the third conductive member 103c is disposed between the first conductive member 103a and the land portion 101d. In some embodiments, the first conductive member 103a is electrically connected to the land portion 101d through the third conductive ember 103c. In some embodiments, the first conductive member 103a is bonded with the land portion 101d by the third conductive member 103c. In some embodiments, the first conductive member 103c is extended from the third conductive member 103c.

In some embodiments, the first die 104 is disposed over the RDL 101. In some embodiments, the first die 104 is surrounded by the molding 102. In some embodiments, the first die 104 is fabricated with a predetermined functional circuit within the first die 104. In some embodiments, the first die 104 is singulated from a semiconductive wafer by a mechanical or laser blade. In some embodiments, the first die 104 comprises a variety of electrical circuits suitable for a particular application. In some embodiments, the electrical circuits include various devices such as transistors, capacitors, resistors, diodes and/or the like.

In some embodiments, the first die 104 comprises of any one of various known types of semiconductor devices such as memories (such as DRAM, SRAMS, flash memories, etc.), microprocessors, application-specific integrated circuits (ASICs), or the like. In some embodiments, the first die 104 is a logic device die, central computing unit (CPU) die, or the like. In some embodiments, the first die 104 is a system on chip (SOC) that integrates all electronic components into a single die. In some embodiments, the first die 104 is a die, a chip or a package. In some embodiments, the first die 104 has a top cross section (a cross section from the top view of the semiconductor structure 100 as shown in FIG. 1) in a quadrilateral, a rectangular or a square shape.

In some embodiments, the first die 104 includes a substrate which comprises semiconductive materials such as silicon. In some embodiments, the substrate of the first die 104 includes several circuitries and electrical components disposed thereon. In some embodiments, the substrate of the first die 104 is a silicon substrate. In some embodiments, the first die 104 includes a first surface 104a and a second surface 104b opposite to the first surface 104a. In some embodiments, the first surface 104a is a front side or active side of the first die 104. In some embodiments, the second surface 104b is a back side or inactive side of the first die 104. In some embodiments, the second surface 104b of the first die 104 is exposed from the molding 102. In some embodiments, the first die 104 includes a sidewall 104f disposed between the first surface 104a and the second surface 104b. In some embodiments, the sidewall 104f is vertically extended between the first surface 104a and the second surface 104b. In some embodiments, the sidewall 104f is processed by singulation, die sawing, laser cutting or similar operations. In some embodiments, the sidewall 104f has roughness caused by the singulation operations. In some embodiments, a roughness of the first surface 104a or the second surface 104b is substantially less than the roughness of the sidewall 104f. In some embodiments, the first surface 104a and the sidewall 104f of the first die 104 are in contact with the molding 102.

In some embodiments, a first die pad 104c is disposed over the first die 104. In some embodiments, the first die pad 104c is disposed over or within the first surface 104a of the first die 104. In some embodiments, the first die pad 104c is electrically connected to a circuitry external to the first die 104, such that a circuitry of the first die 104 is electrically connected to the circuitry external to the first die 104 through the first die pad 104c. In some embodiments, the first die pad 104c is configured to electrically couple with a conductive structure. In some embodiments, the first die pad 104c includes gold, silver, copper, nickel, tungsten, aluminum, palladium and/or alloys thereof.

In some embodiments, a first connector 104d is disposed over and electrically connected with the conductive trace (101d, 101e). In some embodiments, the first connector 104d is disposed between the first die 104 and the land portion 101d. In some embodiments, the first connector 104d is disposed between the first die 104 and the third conductive member 103c. In some embodiments, the first connector 104d is configured to electrically connect to a circuitry or a conductive structure. In some embodiments, the first die 104 is electrically connected to the land portion 101d through the first connector 104d. In some embodiments, the first connector 104d includes conductive material such as includes solder, copper, nickel, gold or etc. In some embodiments, the first connector 104d is a conductive bump, a solder ball, a ball grid array (BGA) ball, controlled collapse chip connection (C4) bump, microbump, a pillar, a post or the like. In some embodiments, the first connector 104d is in a spherical, hemispherical or cylindrical shape.

In some embodiments, a first underfill material 104e is disposed over the RDL 101 to surround the first connector 104d and partially surround the first die 104. In some embodiments, the first underfill material 104e is in contact with the second surface 104b and the sidewall 104f of the first die 104 and the first connector 104d. In some embodiments, the first underfill material 104e is an electrically insulated adhesive for securing a bonding between the first die 104 and the third conductive member 103c. In some embodiments, the first underfill material 104e includes epoxy resin, epoxy molding compounds or etc.

In some embodiments, the second die 105 is disposed over the first die 104. In some embodiments, the second die 105 is disposed over the RDL 101, the molding 102, the first conductive member 103a or the second conductive member 103b. In some embodiments, a dimension of the second die 105 is substantially greater than a dimension of the first die 104. In some embodiments, a width of the second die 105 is substantially greater than a width of the first die 104.

In some embodiments, the second die 105 is fabricated with a predetermined functional circuit within the second die 105. In some embodiments, the second die 105 comprises a variety of electrical circuits suitable for a particular application. In some embodiments, the electrical circuits include various devices such as transistors, capacitors, resistors, diodes and/or the like. In some embodiments, the second die 105 comprises of any one of various known types of semiconductor devices such as memories (such as DRAM, SRAMS, flash memories, etc.), microprocessors, application-specific integrated circuits (ASICs), central computing unit (CPU) or the like. In some embodiments, the second die 105 is a die, a chip or a package. In some embodiments, the second die 105 has a top cross section (a cross section from the top view of the semiconductor structure 100 as shown in FIG. 1) in a quadrilateral, a rectangular or a square shape.

In some embodiments, the second die 105 includes a substrate which comprises semiconductive materials such as silicon. In some embodiments, the substrate of the second die 105 includes several circuitries and electrical components disposed thereon. In some embodiments, the substrate of the second die 105 is a silicon substrate. In some embodiments, the second die 105 includes a third surface 105a and a fourth surface 105b opposite to the third surface 105a. In some embodiments, the third surface 105a is a front side or active side of the second die 105. In some embodiments, the fourth surface 105b is a back side or inactive side of the second die 105.

In some embodiments, a second connector 105c is disposed over and electrically connected to the second conductive member 103b. In some embodiments, the second connector 105c is disposed between the second die 105 and the second conductive member 103b. In some embodiments, the second connector 105c disposed over the first conductive member 103a is absent. In some embodiments, the second connector 105c is only disposed over the second conductive member 103b. In some embodiments, the second connector 105c is isolated from the first conductive member 103a. In some embodiments, the second die 105 is electrically connected to the conductive trace (101d, 101e), the first die 104 or the second conductive member 103b through the second connector 105c. In some embodiments, the first conductive member 103a is electrically isolated from the second die 105.

In some embodiments, the second connector 105c includes conductive material such as includes solder, copper, nickel, gold or etc. In some embodiments, the second connector 105c is a conductive bump, a solder ball, a ball grid array (BGA) ball, controlled collapse chip connection (C4) bump, microbump, a pillar, a post or the like. In some embodiments, the second connector 105c is in a spherical, hemispherical or cylindrical shape.

In some embodiments, an second underfill material 106 is disposed between the second die 105 and the molding 102. In some embodiments, the second underfill material 106 surrounds the second connector 105c. In some embodiments, the second underfill material 106 is in contact with an outer surface of the second connector 105c. In some embodiments, the second underfill material 106 is disposed between the third surface 105a and the molding 102. In some embodiments, the second underfill material 106 surrounds the third surface 105a. In some embodiments, the second underfill material 106 is in contact with a sidewall of the second die 105. In some embodiments, the fourth surface 105b of the second die 105 is exposed from the second underfill material 106. In some embodiments, a portion of the second underfill material 106 is disposed over or is in contact with the first conductive member 103a. In some embodiments, the second underfill material 106 is an electrically insulated adhesive for securing a bonding between the second die 105 and the second conductive member 103b. In some embodiments, the second underfill material 106 includes epoxy resin, epoxy molding compounds or etc.

In some embodiments, the conductive bump 107 is disposed over the RDL 101. In some embodiments, the conductive bump 107 is electrically connected to the conductive trace (101d, 101e), the first conductive member 103a, the second conductive member 103b, the third conductive member 103c, the first die 104, the second connector 105c or the second die 105. In some embodiments, the conductive bump 107 is bonded with the land portion 101d disposed over the second side 101c of the RDL 101. In some embodiments, the conductive bump 107 is configured to bond with a conductive structure. In some embodiments, the conductive bump 107 is configured to electrically connect to a printed circuit board (PCB). In some embodiments, the conductive bump 107 includes conductive material such as includes solder, copper, nickel, gold or etc. In some embodiments, the conductive bump 107 is a conductive bump, a solder ball, a ball grid array (BGA) ball, controlled collapse chip connection (C4) bump, microbump, a pillar, a post or the like. In some embodiments, the conductive bump 107 is in a spherical, hemispherical or cylindrical shape.

Figure 2:
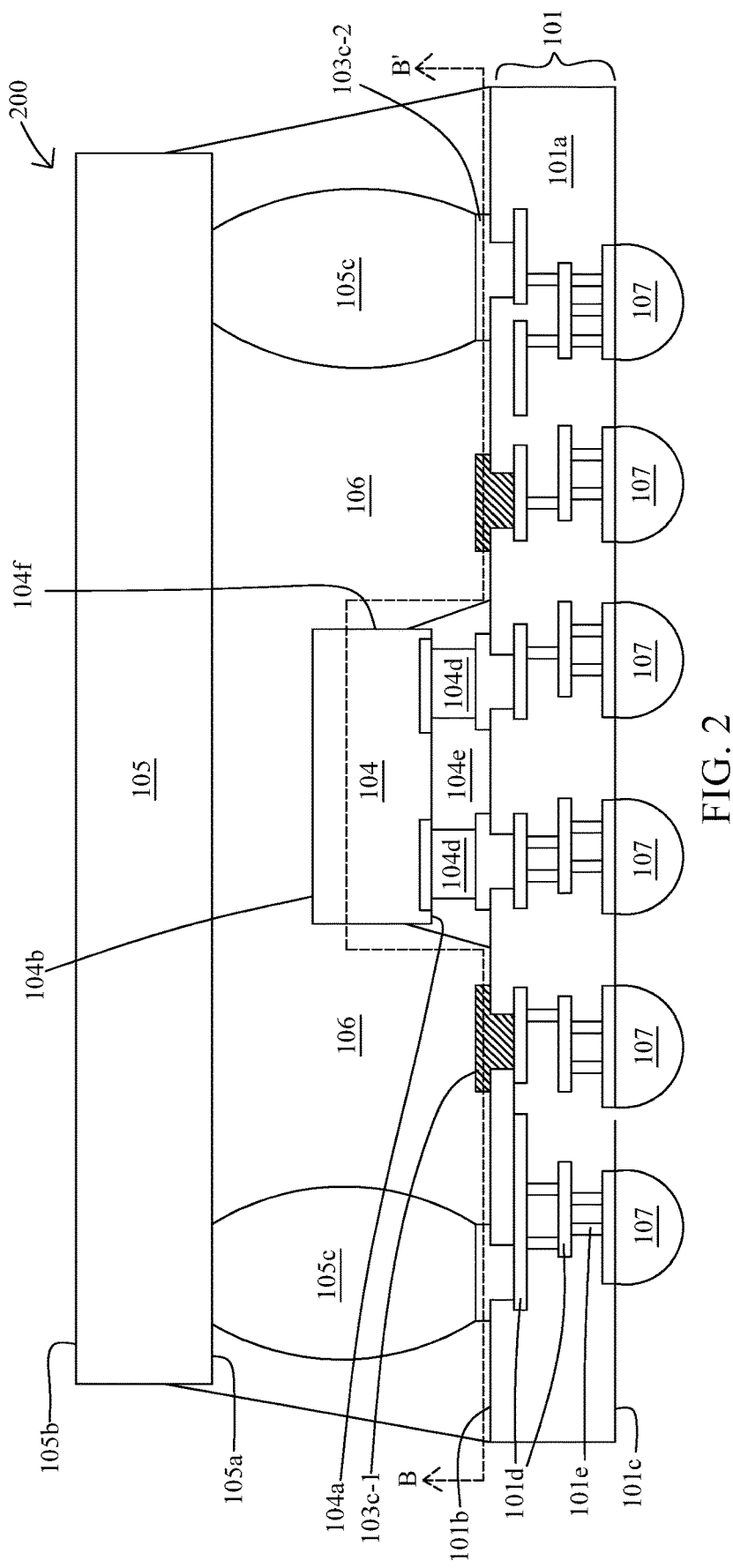
FIG. 2 is a schematic cross sectional view of a semiconductor structure in accordance with some embodiments of the present disclosure.

FIG. 2 is a schematic cross sectional view of a semiconductor structure 200 in accordance with various embodiments of the present disclosure. In some embodiments, the semiconductor structure 200 includes a RDL 101, a first die 104, a second die 105 and a conductive bump 107, which have similar configuration as those described above or illustrated in FIG. 1.

In some embodiments, the RDL 101 includes a dielectric layer 101a, a land portion 101d and a via portion 101e, which have similar configuration as those described above or illustrated in FIG. 1. In some embodiments, the first die 104 is disposed over the RDL 101 and electrically connected to the land portion 101d, the via portion 101e or the conductive bump 107 through a first connector 104d. In some embodiments, the first connector 104d has similar configuration as the one described above or illustrated in FIG. 1.

In some embodiments, a third conductive member (103c-1, 103c-2) is disposed over or electrically coupled with the land portion 101d of the RDL 101. In some embodiments, the third conductive member 103c is a pad, a bond pad or the like. In some embodiments, the third conductive member 103c is partially disposed over the dielectric layer 101a and partially surrounded by the dielectric layer 101a. In some embodiments, In some embodiments, the third conductive member (103c-1, 103c-2) includes conductive material such as gold, silver, copper, nickel, tungsten, aluminum, palladium and/or alloys thereof.

In some embodiments, an second underfill material 106 is disposed over the RDL 101. In some embodiments, the second underfill material 106 is disposed over the dielectric layer 101a. In some embodiments, the second underfill material 106 surrounds the first die 104. In some embodiments, the second underfill material 106 covers or surrounds the third conductive member 103c-1. In some embodiments, a top surface or a side surface of the third conductive member 103c-1 is in contact with the second underfill material 106. In some embodiments, the third conductive member 103c-1 is a dummy pad. In some embodiments, the third conductive member 103c-1 is served as a testing terminal for testing the first die 104, the land portion 101d or the via portion 101e.

In some embodiments, the first connector 104d is surrounded by the second underfill material 106. In some embodiments, the first surface 104a, the second surface 104b and the sidewall 104f of the first die 104 are in contact with the second underfill material 106. In some embodiments, the first connector 104d is in contact with the second underfill material 106. In some embodiments, the second underfill material 106 includes epoxy resin, epoxy molding compounds or etc.

In some embodiments, the second die 105 is disposed over the RDL 101, the first die 104 and the second underfill material 106. In some embodiments, the second die 105 is electrically connected to the first die 104, the land portion 101d, the via portion 101e or the conductive bump 107 through a second connector 105c. In some embodiments, the second die 105 has similar configuration as the one described above or illustrated in FIG. 1.

In some embodiments, the second underfill material 106 surrounds the second connector 105c. In some embodiments, the second connector 105c is disposed over the third conductive member 103c-2. In some embodiments, the third conductive member 103c-1 is electrically isolated from the second die 105. In some embodiments, the second connector 105c disposed over the third conductive member 103c-1 is absent. In some embodiments, the second connector 105c is only disposed over the third conductive member 103c-2. In some embodiments, the second underfill material 106 is an electrically insulated adhesive for securing a bonding between the second die 105 and the third conductive member 103c-2. In some embodiments, the second connector 105c includes conductive material such as includes solder, copper, nickel, gold or etc. In some embodiments, the second connector 105c is a conductive bump, a solder ball, a ball grid array (BGA) ball, controlled collapse chip connection (C4) bump, microbump, a pillar, a post or the like. In some embodiments, the second connector 105c is in a spherical, hemispherical or cylindrical shape.

In some embodiments, the second underfill material 106 is in contact with an outer surface of the second connector 105c. In some embodiments, the second underfill material 106 is disposed between the third surface 105a and the dielectric layer 101a. In some embodiments, the second underfill material 106 surrounds the third surface 105a. In some embodiments, the second underfill material 106 is in contact with a sidewall of the second die 105. In some embodiments, a portion of the second underfill material 106 is disposed over or is in contact with the third conductive member 103c-1. In some embodiments, the second underfill material 106 includes epoxy resin, epoxy molding compounds or etc.

Figure 3:
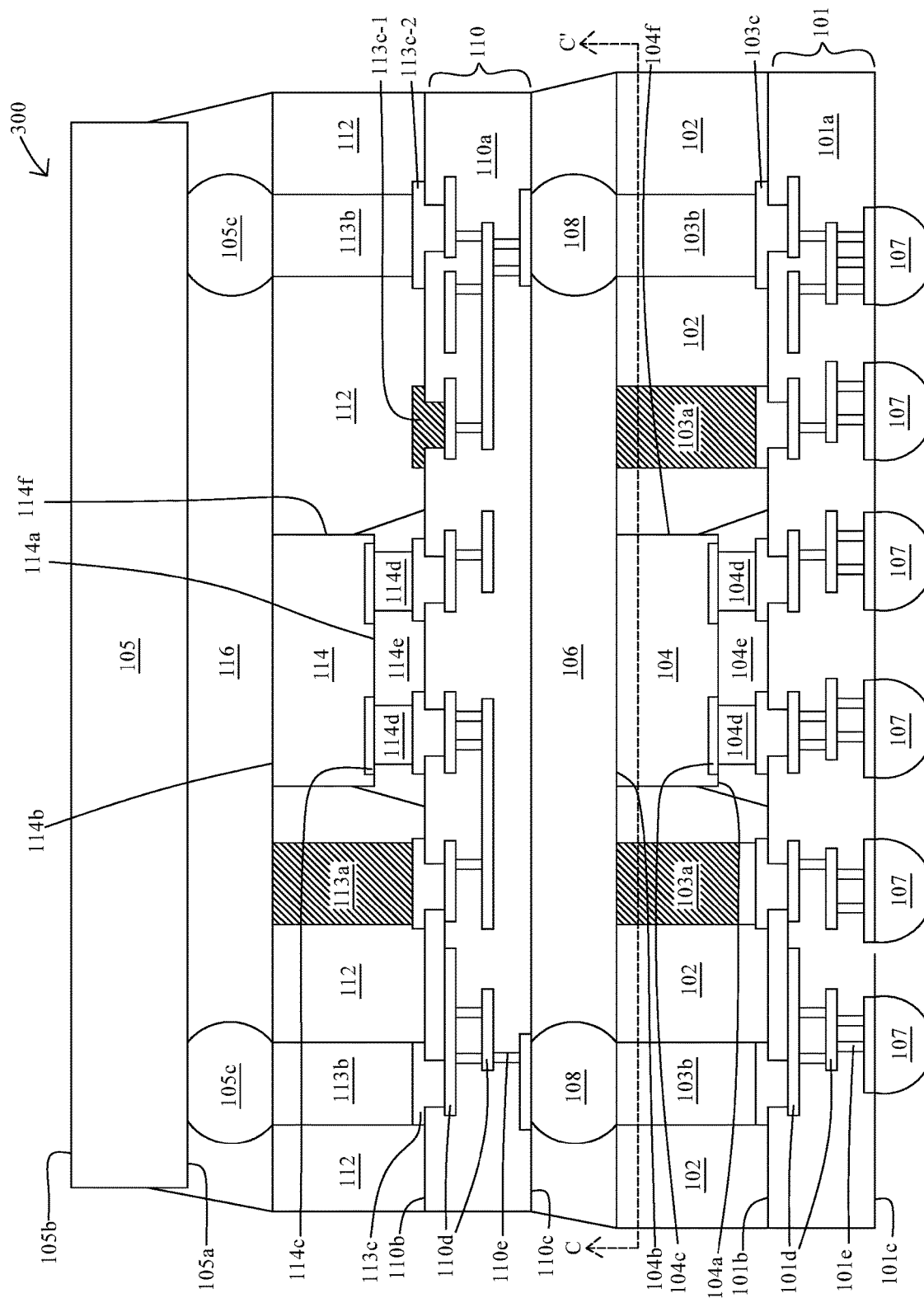
FIG. 3 is a schematic cross sectional view of a semiconductor structure in accordance with some embodiments of the present disclosure.

FIG. 3 is a schematic cross sectional view of a semiconductor structure 300 in accordance with various embodiments of the present disclosure. In some embodiments, the semiconductor structure 300 includes a first RDL 101, a first molding 102, a first conductive member 103a, a second conductive member 103b, a third conductive member 103c, a first die 104, a second underfill material 106 and a first conductive bump 107, which have similar configuration as those described above or illustrated in FIG. 1 or 2.

In some embodiments, a third connector 108 is disposed over the second conductive member 103b. In some embodiments, the third connector 108 is surrounded by the second underfill material 106. In some embodiments, a third connector 108 is disposed over and electrically connected to the second conductive member 103b. In some embodiments, the third connector 108 disposed over the first conductive member 103a is absent. In some embodiments, the third connector 108 is only disposed over the second conductive member 103b. In some embodiments, the third connector 108 is isolated from the first conductive member 103a. In some embodiments, the third connector 108 includes conductive material such as includes solder, copper, nickel, gold or etc. In some embodiments, the third connector 108 is a conductive bump, a solder ball, a ball grid array (BGA) ball, controlled collapse chip connection (C4) bump, microbump, a pillar, a post or the like. In some embodiments, the third connector 108 is in a spherical, hemispherical or cylindrical shape.

In some embodiments, a second RDL 110 is disposed over the underfill 106, the molding 102 and the first RDL 101. In some embodiments, the second RDL 110 includes a second dielectric layer 110a, a second land portion 110d and a second via portion 110e. In some embodiments, the second RDL 110, the second dielectric layer 110a, the second land portion 110d and the second via portion 110e have similar configuration as the first RDL 101, the first dielectric layer 101a, the first land portion 101d and the first via portion 101e respectively described above or illustrated in FIG. 1 or 2.

In some embodiments, a second molding 112 is disposed over the second RDL 110. In some embodiments, the second molding 112 has similar configuration as the first molding 102 described above or illustrated in FIG. 1 or 2.

In some embodiments, a fourth conductive member 113a and a fifth conductive member 113b are extended through the second molding 112. In some embodiments, a sixth conductive member (113c-1, 113c-2) is extended from the second molding 112 to the second dielectric layer 110a. In some embodiments, the fourth conductive member 113a, the fifth conductive member 113b and the sixth conductive member (113c-1, 113c-2) have similar configuration as the first conductive member 103a, the second conductive member 103b and the third conductive member (103c-1, 103c-2) respectively described above or illustrated in FIG. 1 or 2. In some embodiments, the sixth conductive member 113c-1 is covered by the second molding 112. In some embodiments, a top surface of the sixth conductive member 113c-1 is in contact with the second molding 112.

In some embodiments, a third die 114 is disposed over the second RDL 110. In some embodiments, the third die 114 is surrounded by the second molding 112. In some embodiments, the third die 114 is electrically connected to the first land portion 101d or the first via portion 101e through a fourth connector 114d. In some embodiments, a fourth underfill material 114e is disposed between the third die 114 and the second RDL 110 to surround the fourth connector 14d. In some embodiments, the third die 114, the fourth connector 114d and the fourth underfill material 114e have similar configuration as the first die 104, the first connector 104d and the first underfill material 104e respectively described above or illustrated in FIG. 1 or 2.

In some embodiments, a second die 105 is disposed over the second molding 112, and a second connector 105c is disposed over the fifth conductive member 113b to electrically connect the second die 105 to the fifth conductive member 113b through the second connector 105c. In some embodiments, the second die 105 and the second connector 105c have similar configuration as described above or illustrated in FIG. 1 or 2. In some embodiments, the second connector 105c disposed over the fourth conductive member 113a is absent. In some embodiments, the fourth conductive member 113a is electrically isolated from the second die 105. In some embodiments, the second connector 105c is only disposed over the fifth conductive member 113b.

In some embodiments, a third underfill material 116 is disposed between the second die 105 and the second molding 112. In some embodiments, the third underfill material 116 surrounds the second connector 105c. In some embodiments, the third underfill material 116 is disposed over or is in contact with the fourth conductive member 113a. In some embodiments, the third underfill material 116 has similar configuration as the second underfill material 106 described above or illustrated in FIG. 1 or 2.

Figure 4:
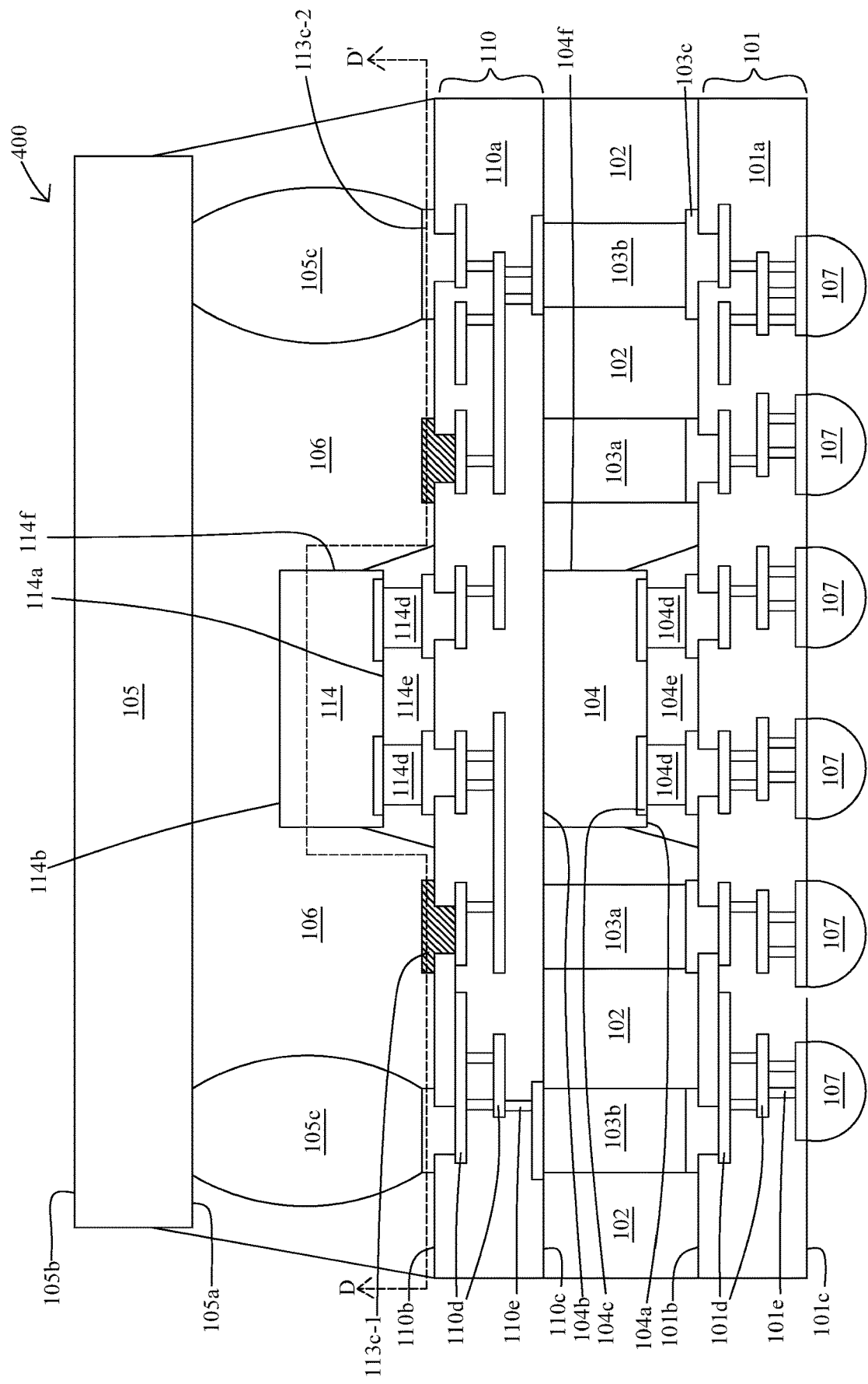
FIG. 4 is a schematic cross sectional view of a semiconductor structure in accordance with some embodiments of the present disclosure.

FIG. 4 is a schematic cross sectional view of a semiconductor structure 400 in accordance with various embodiments of the present disclosure. In some embodiments, the semiconductor structure 400 includes a first RDL 101, a first molding 102, a first conductive member 103a, a second conductive member 103b, a third conductive member 103c, a first die 104, a first conductive bump 107, a second RDL 110, a third die 114 and a sixth conductive member (113c-1, 113c-2), which have similar configuration as those described above or illustrated in any one of FIGS. 1-3.

In some embodiments, the second RDL 110 is disposed over the second molding 102. In some embodiments, the third die 114 is disposed over the second RDL 1110. In some embodiments, the third die 114 is surrounded by the underfill material 106. In some embodiments, a third surface 114a and a fourth surface 114b of the third die 114 are in contact with the underfill material 106. In some embodiments, a second connector 105c is disposed over the sixth conductive member 113c-2. In some embodiments, the second connector 105c disposed over the sixth conductive member 113c-1 is absent. In some embodiments, the second die 105 is electrically connected to the second land portion 110d through the second connector 105c. In some embodiments, the sixth conductive member 113c-1 is electrically isolated from the second die 105. In some embodiments, the sixth conductive member 113c-1 is covered by the underfill material 106. In some embodiments, a top surface of the sixth conductive member 113c-1 is in contact with the underfill material 106.

Figure 5:
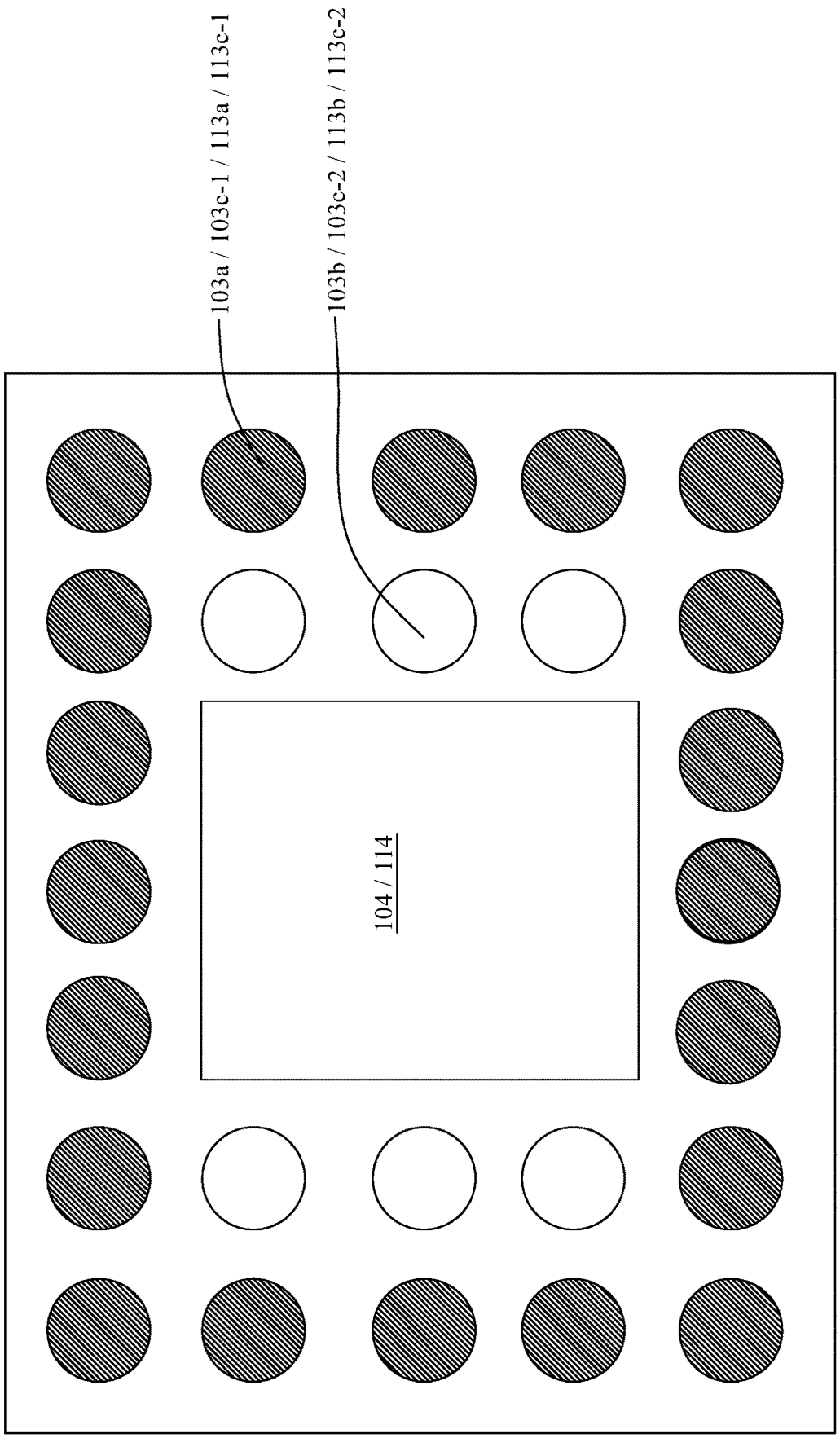
FIGS. 5-8 are schematic cross sectional views of conductive members in various arrangements.
Figure 6:
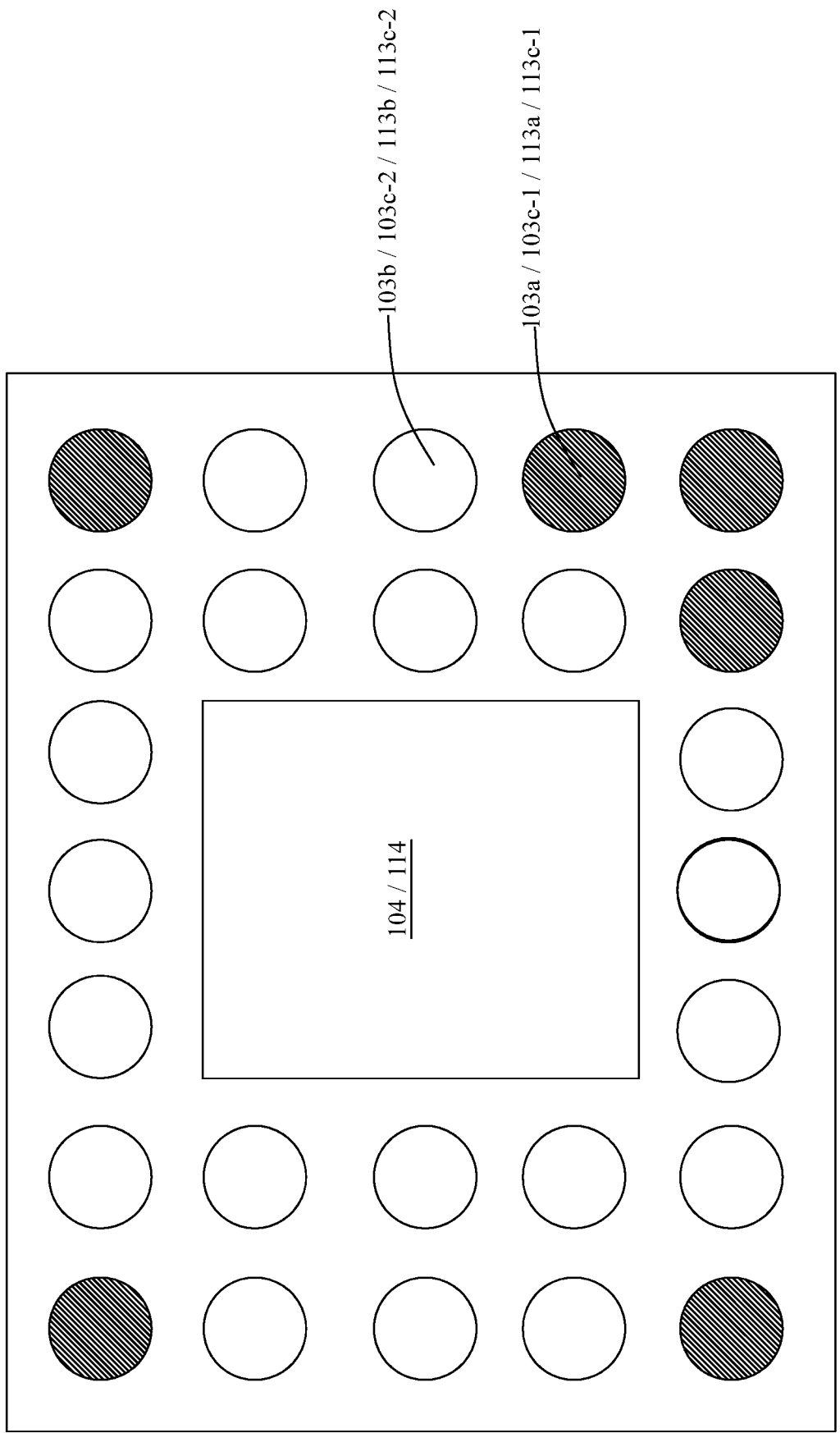

FIGS. 5-8 are schematic cross sectional views of a semiconductor structure (100, 200, 300, 400) along AA', BB', CC' or DD' in FIGS. 1-4, showing various arrangements of conductive members (103a, 103b, 103c-1, 103c-2, 113a, 113b, 113c-1, 113c-2). In some embodiments as shown in FIG. 5, the first conductive member 103a, the third conductive member 103c-1, the fourth conductive member 113a or the sixth conductive member 113c-1 is arranged proximal to a periphery of the semiconductor structure (100, 200, 300, 400). In some embodiments as shown in FIG. 6, the first conductive member 103a, the third conductive member 103c-1, the fourth conductive member 113a or the sixth conductive member 113c-1 is arranged at or near a corner of the semiconductor structure (100, 200, 300, 400).

Figure 7:
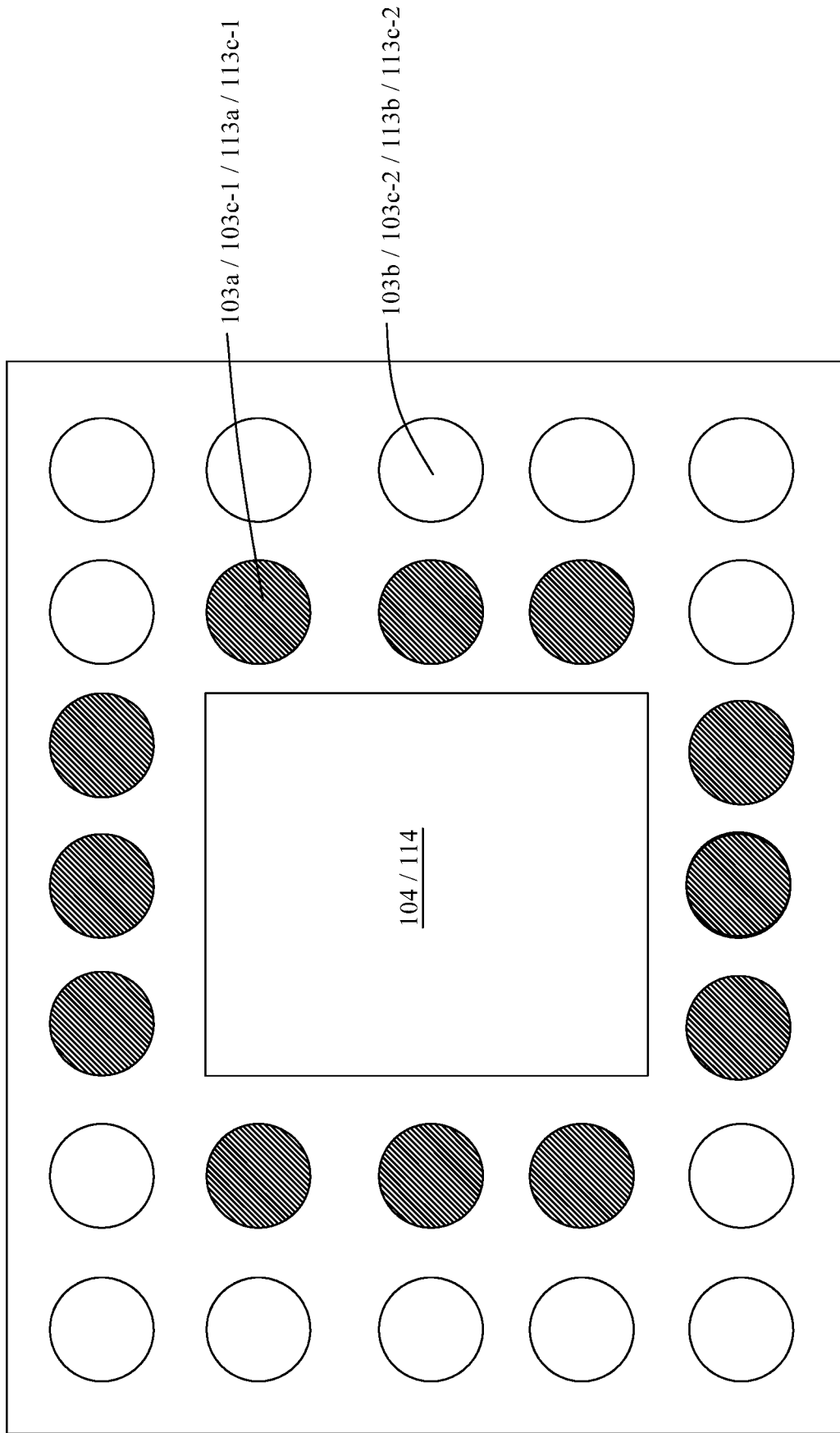
Figure 8:
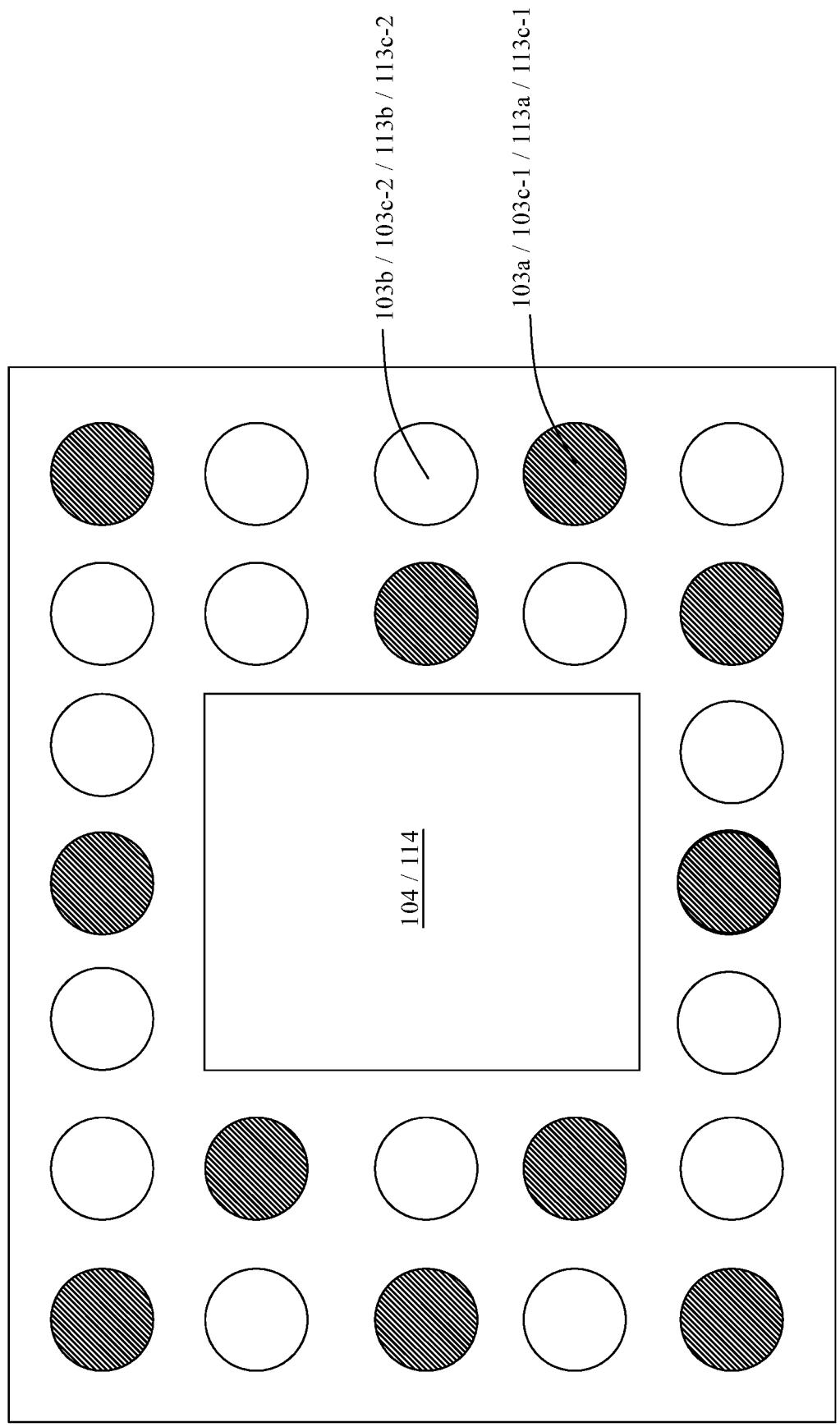

In some embodiments as shown in FIG. 7, the first conductive member 103a, the third conductive member 103c-1, the fourth conductive member 113a or the sixth conductive member 113c-1 is arranged proximal to the first die 104 or the third die 114. In some embodiments, the first conductive member 103a, the third conductive member 103c-1, the fourth conductive member 113a or the sixth conductive member 113c-1 surrounds the first die 104 or the third die 114. In some embodiments as shown in FIG. 8, the first conductive member 103a, the third conductive member 103c-1, the fourth conductive member 113a or the sixth conductive member 113c-1 is arranged in staggered or random manner.

Figure 9:
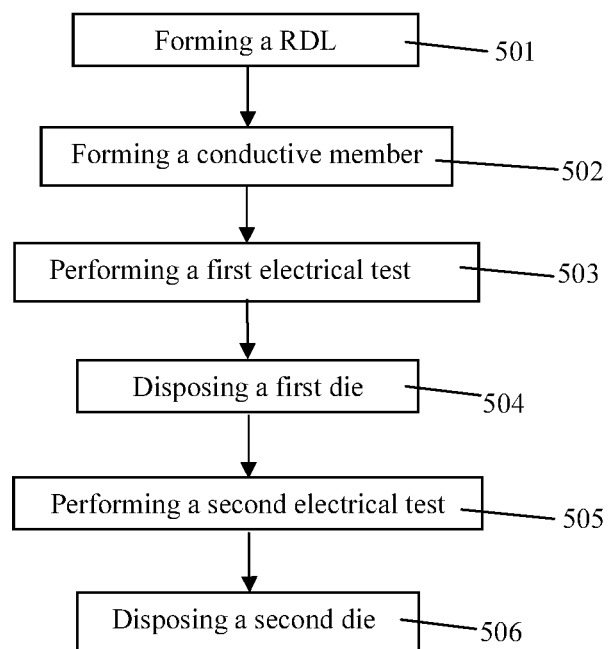
FIG. 9 is a flow diagram of a method of manufacturing a semiconductor structure in accordance with some embodiments of the present disclosure.

In the present disclosure, a method of manufacturing a semiconductor structure (100, 300, 400) is also disclosed. In some embodiments, a semiconductor structure (100, 300, 400) is formed by a method 500. The method 500 includes a number of operations and the description and illustration are not deemed as a limitation as the sequence of the operations. FIG. 9 is an embodiment of the method 500 of manufacturing the semiconductor structure (100, 300, 400). The method 500 includes a number of operations (501, 502, 503, 504, 505, 506).

In operation 501, a redistribution layer (RDL) 101 is formed as shown in FIG. 9A. In some embodiments, a carrier 109 is provided, and the RDL 101 is formed over the carrier 109. In some embodiments, a carrier 109 is provided for temporarily supporting components subsequently disposed thereon. In some embodiments, the carrier 109 is a substrate or a wafer. In some embodiments, the carrier 109 includes silicon, glass, ceramic or the like.

In some embodiments, the RDL 101 is formed by disposing a dielectric layer 101a over the carrier 109, removing some portions of the dielectric layer 101a to form some recesses, and disposing a conductive material into the recesses to form conductive trace (land portion 101d, via portion 101e) within the dielectric layer 101a and a third conductive member 103c partially within the dielectric layer 101a. In some embodiments, the third conductive member 103c is a conductive pad. In some embodiments, the RDL 101, the dielectric layer 101a, the land portion 101d and the via portion 101e have similar configuration as those described above or illustrated in FIG. 1 or 3.

In some embodiments, the dielectric layer 101a is disposed by spin coating, chemical vapor deposition (CVD) or any other suitable operations. In some embodiments, the portions of the dielectric layer 101a are removed by photolithography, etching or any other suitable operations. In some embodiments, the conductive material is disposed by sputtering, electroplating or any other suitable operations.

In operation 502, a first conductive member 103a and a second conductive member 103b are formed over the RDL 101 as shown in FIG. 9B. In some embodiments, the first conductive member 103a and the second conductive member 103b are formed over the third conductive member 103c. In some embodiments, the first conductive member 103a and the second conductive member 103b are extended from the third conductive member 103c. In some embodiments, the first conductive member 103a and the second conductive member 103b are electrically connected to the conductive trace (101d, 101e) in the RDL 101. In some embodiments, the first conductive member 103a and the second conductive member 103b are conductive vias. In some embodiments, the first conductive member 103a and the second conductive member 103b have similar configuration as those described above or illustrated in FIG. 1 or 3.

In some embodiments, the first conductive member 103a and the second conductive member 103b are formed by disposing a photoresist over the RDL 101, removing some portions of the photoresist to form some recesses over the third conductive member 103c, and disposing a conductive material over the third conductive member 103c. In some embodiments, the first conductive member 103a and the second conductive member 103b are formed by sputtering, electroplating or any other suitable operations. In some embodiments, the first conductive member 103a and the second conductive member 103b are formed separately or simultaneously.

Figure 9C:
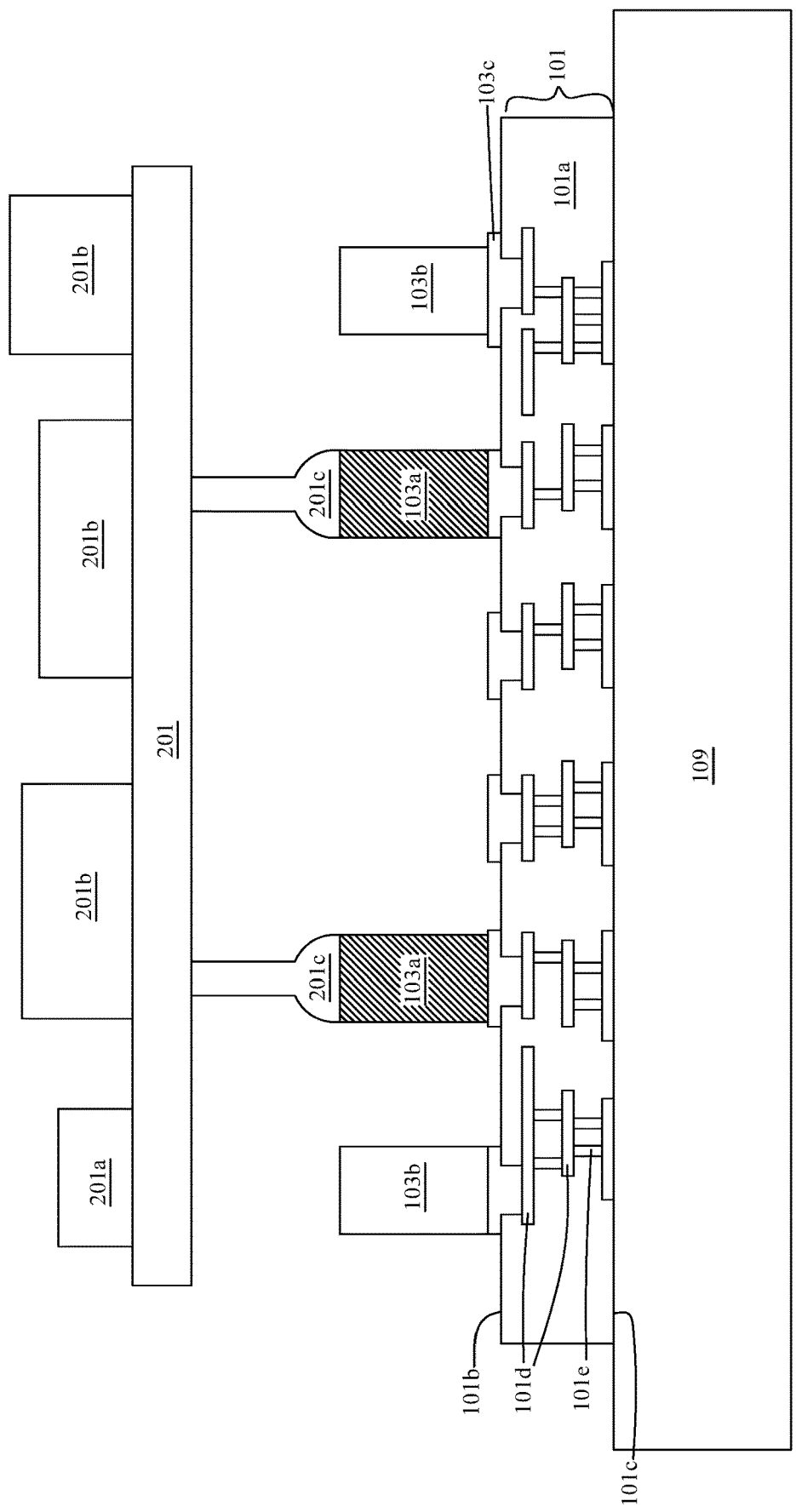

In operation 503, a first electrical test is performed as shown in FIG. 9C. In some embodiments, the first electrical test is performed through the first conductive member 103a. In some embodiments, the first conductive member 103a is a dummy conductive member for testing. In some embodiments, the first conductive member 103a or the second conductive member 103b is exposed from the RDL 101 upon the performance of the first electrical test. In some embodiments, the first electrical test is configured to test an interconnection of the conductive trace (101d, 101e) in the RDL 101 or identify a failure of the conductive trace (101d, 101e) in the RDL 101 and problematic RDL 101 such as poor electrical interconnection, short circuit, crack, delamination, etc. As such, problematic RDL 101 or conductive trace (101d, 101e) can be identified immediately after the formation of the first conductive member 103a or the second conductive member 103b.

In some embodiments, the first electrical test is performed by electrically connecting a probe card 201 to the conductive trace (101d, 101e) in the RDL 101 through the first conductive member 103a. In some embodiments, the probe card 201 is electrically connected to the first conductive member 103a through a probe card terminal 201c. In some embodiments, the probe card 201 includes a power supply 201a and is embedded with a chip 201b or a functional circuitry such as a memory, a dynamic random access memory (DRAM), a flash memory, a NAND flash memory or a serial peripheral interface (SPI) memory.

Figure 9D:
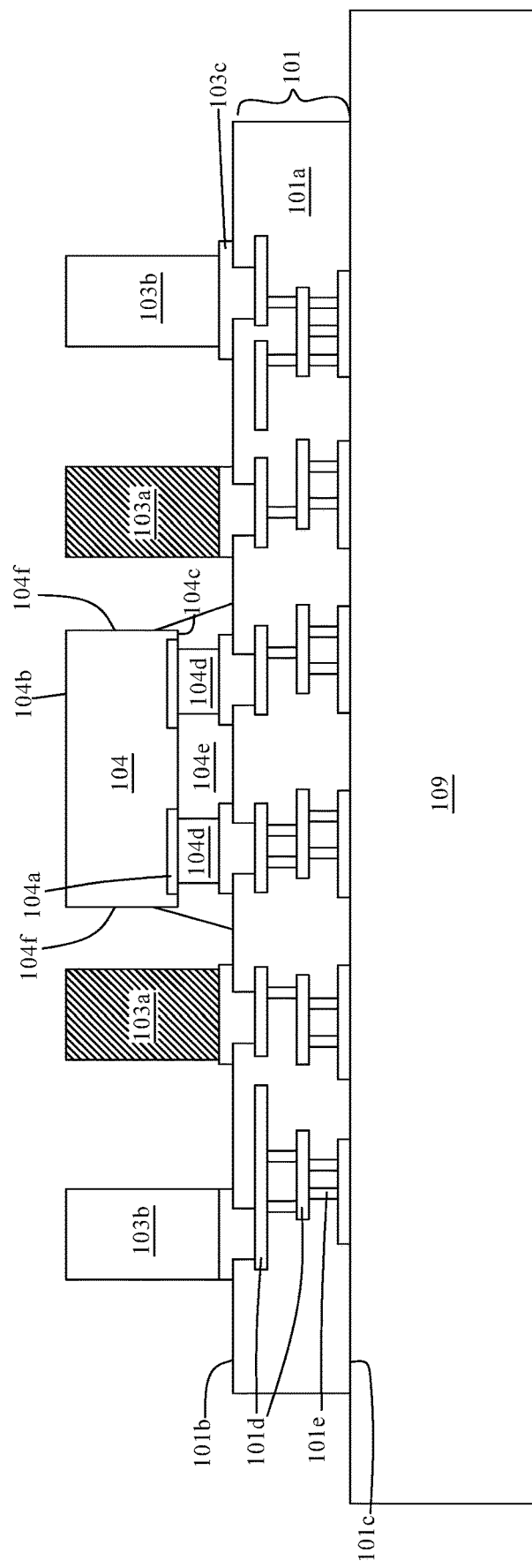

In operation 504, a first die 104 is disposed over the RDL 101 as shown in FIG. 9D. In some embodiments, the first electrical test (the operation 503) is performed prior to the disposing of the first die 104 (the operation 504). In some embodiments, the first die 104 is disposed over the third conductive member 103c. In some embodiments, the first die 104 includes a first die pad 104c disposed over or within a surface of the first die 104 and a first connector 104d disposed over the first die pad 104c and bonded with the third conductive member 103c. In some embodiments, the first die 104 is surrounded by the first conductive member 103a or the second conductive member 103b. In some embodiments, the first conductive member 103a or the second conductive member 103b is electrically connected to the first die 104 through the conductive trace (101d, 101e). In some embodiments, a first underfill material 104e is disposed between the RDL 101 and the first die 104 to surround the first die 104. In some embodiments, the first die 104 includes a sidewall 104f disposed between a first surface 104a and a second surface 104b. In some embodiments, the sidewall 104f is vertically extended between the first surface 104a and the second surface 104b. In some embodiments, the first die 104 is singulated from a wafer or substrate. In some embodiments, the first die 104 is formed by cutting the wafer along the sidewall 104f. In some embodiments, the first die 104 is singulated by die sawing, laser cutting or any other suitable operations. In some embodiments, the sidewall 104f has roughness after the singulation operations. In some embodiments, a roughness of the first surface 104a or the second surface 104b is substantially less than the roughness of the sidewall 104f. In some embodiments, the first die 104, the first surface 104a, the second surface 104b, the first die pad 104c, the first connector 104d, the first underfill material 104e and the sidewall 104f have similar configuration as those described above or illustrated in FIG. 1 or 3.

Figure 9E:
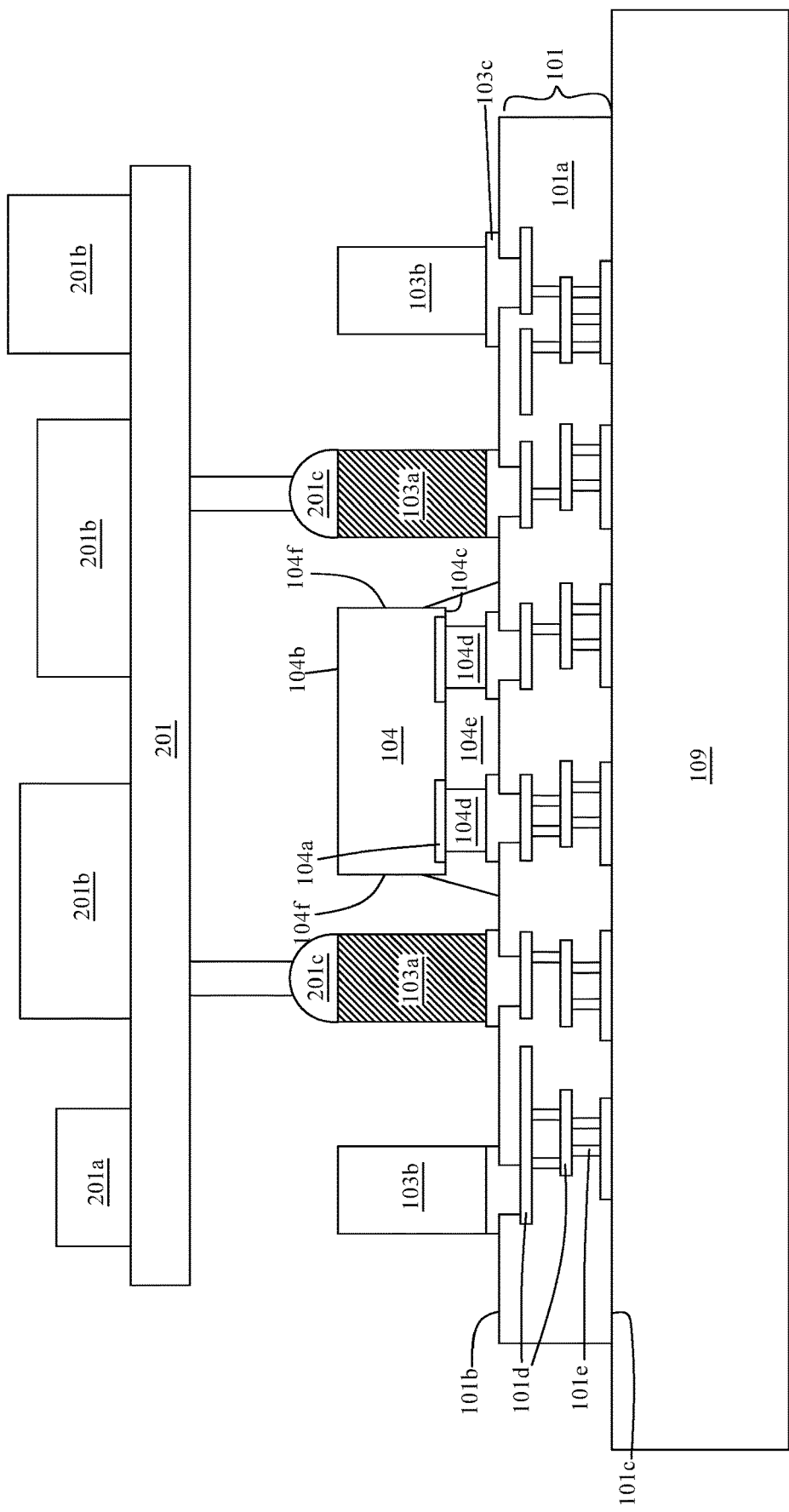

In operation 505, a second electrical test is performed as shown in FIG. 9E. In some embodiments, the second electrical test is performed through the first conductive member 103a. In some embodiments, the first conductive member 103a, the second conductive member 103b is exposed from the RDL 101 upon the performance of the second electrical test. In some embodiments, the first die 104 is exposed upon the performance of the second electrical test. In some embodiments, the first surface 104a, the second surface 104b or the sidewall 104f of the first die 104 is exposed to the ambient environment upon the performance of the second electrical test. In some embodiments, the second surface 104b and the sidewall 104f of the first die 104 are exposed to the ambient environment upon the performance of the second electrical test. In some embodiments, the second electrical test is configured to test the first die 104 or identify problematic first die 104 such as failure of the first die 104, poor electrical interconnection in the first die 104, short circuit in the first die 104, etc. As such, problematic first die 104 can be identified immediately after the disposing of the first die 104.

In some embodiments, the second electrical test is performed by electrically connecting the probe card 201 to the first die 104 through the first conductive member 103a. In some embodiments, the probe card 201 is electrically connected to the first die 104 through a probe card terminal 201c. In some embodiments, the probe card 201 includes the power supply 201a and is embedded with the chip 201b or a functional circuitry such as a memory, a dynamic random access memory (DRAM), a flash memory, a NAND flash memory or a serial peripheral interface (SPI) memory.

Figure 9F:
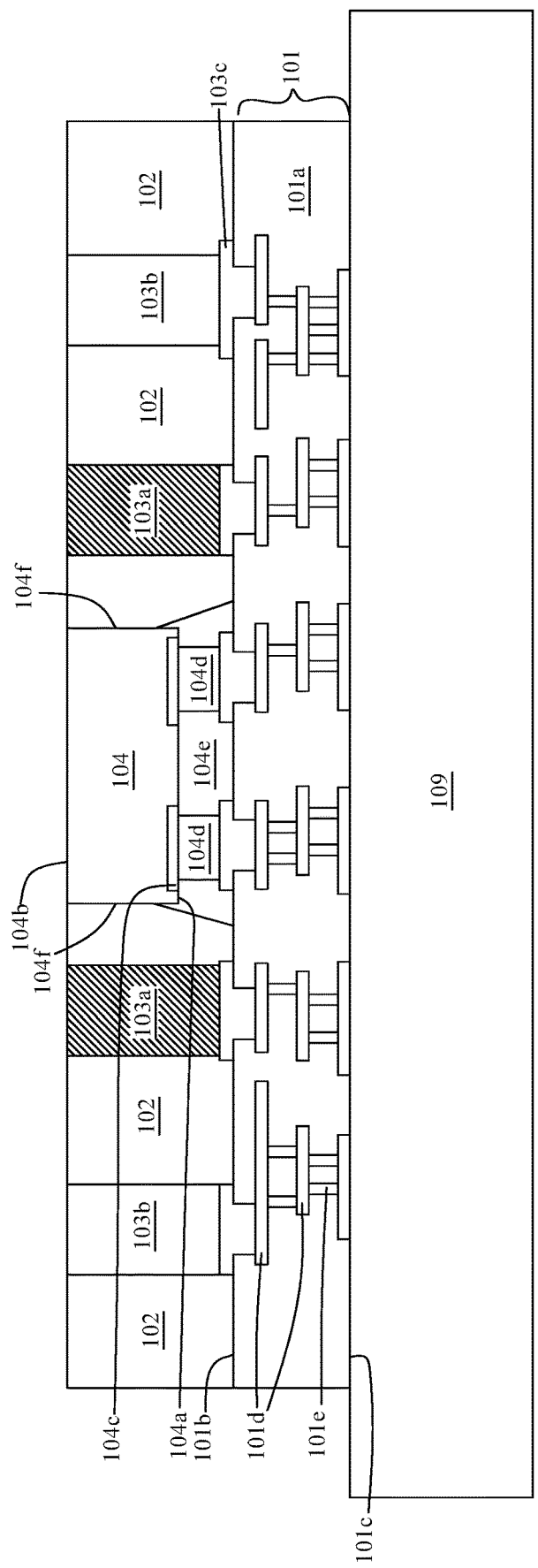

In some embodiments, a molding 102 is formed as shown in FIG. 9F. In some embodiments, the molding 102 is formed after the performance of the first electrical test (the operation 503) or the performance of the second electrical test (the operation 504). In some embodiments, the molding 102 is formed by transfer molding, injection molding or any other suitable operations. In some embodiments, the molding 102 is disposed over the RDL 101. In some embodiments, the molding 102 surrounds the first die 104, the first conductive member 103a and the second conductive member 103b. In some embodiments, the third conductive member 103c is partially surrounded by the molding 102. In some embodiments, the molding 102 is in contact with the second surface 104b and the sidewall 104f of the first die 104, an outer surface of the first conductive member 103a and an outer surface of the second conductive member 103b. In some embodiments, the molding 102 has similar configuration as the one described above or illustrated in FIG. 1 or 3.

Figure 9G:
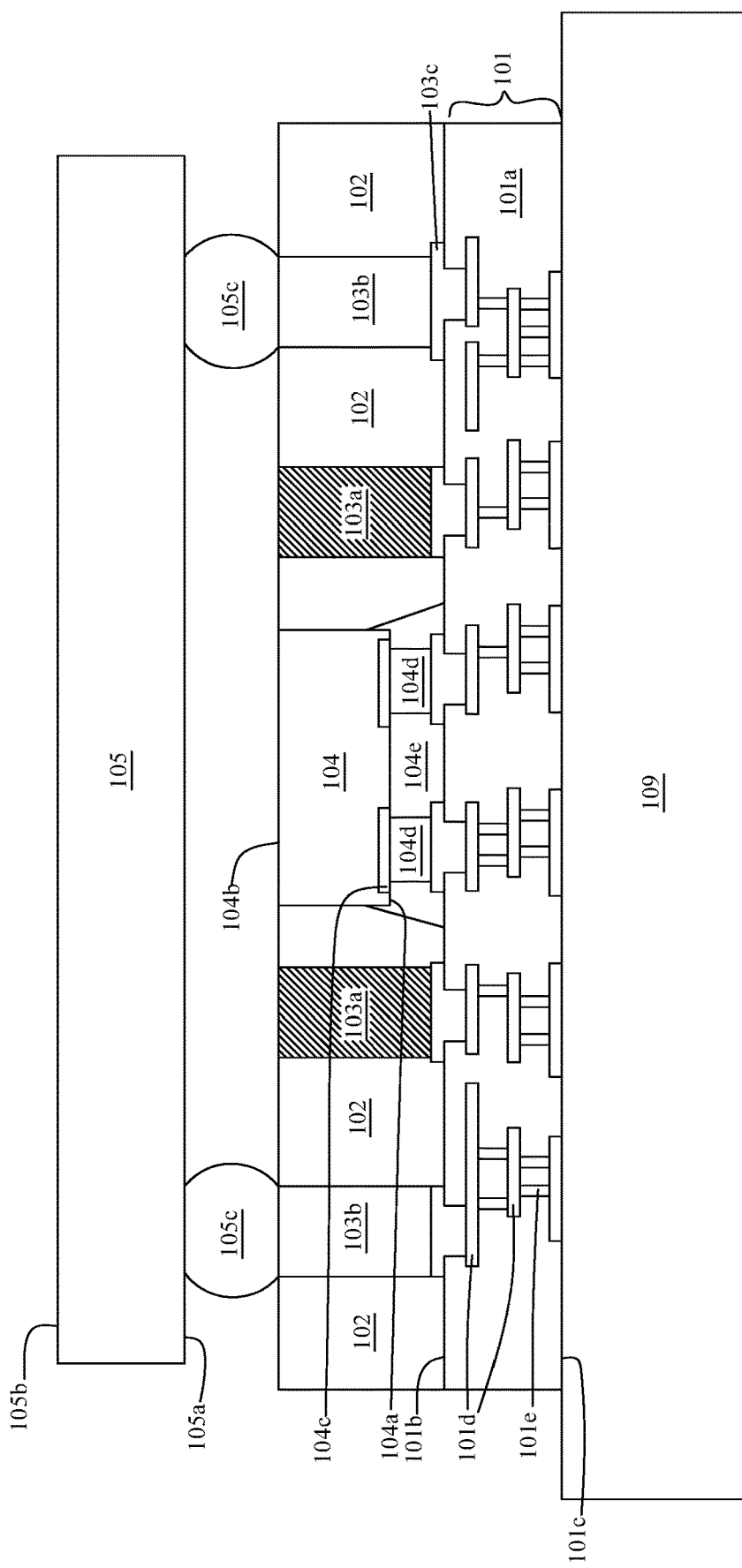

In operation 506, a second die 105 is disposed over the first die 104 as shown in FIG. 9G. In some embodiments, the second die 105 is disposed over the first conductive member 103a or the second conductive member 103b. In some embodiments, the second electrical test (the operation 505) is performed prior to the disposing of the second die 105. In some embodiments, the second die 105 includes a second connector 105c disposed over the second conductive member 103b. In some embodiments, the second connector 105c is electrically connected to the second conductive member 103b. In some embodiments, the second die 105 is electrically connected to the conductive trace (101d, 101e) through the second connector 105c and the second conductive member 103b. In some embodiments, the second connector 105c is only disposed over or electrically connected to the second conductive member 103b. In some embodiments, the first conductive member 103a is electrically isolated from the second die 105 or the second connector 105c. In some embodiments, the first conductive member 103a is isolated from the second die 105 or the second connector 105c. In some embodiments, the second connector 105c disposed over the first conductive member 103a is absent. In some embodiments, the second die 105 has similar configuration as the one described above or illustrated in FIG. 1 or 3.

Figure 9H:
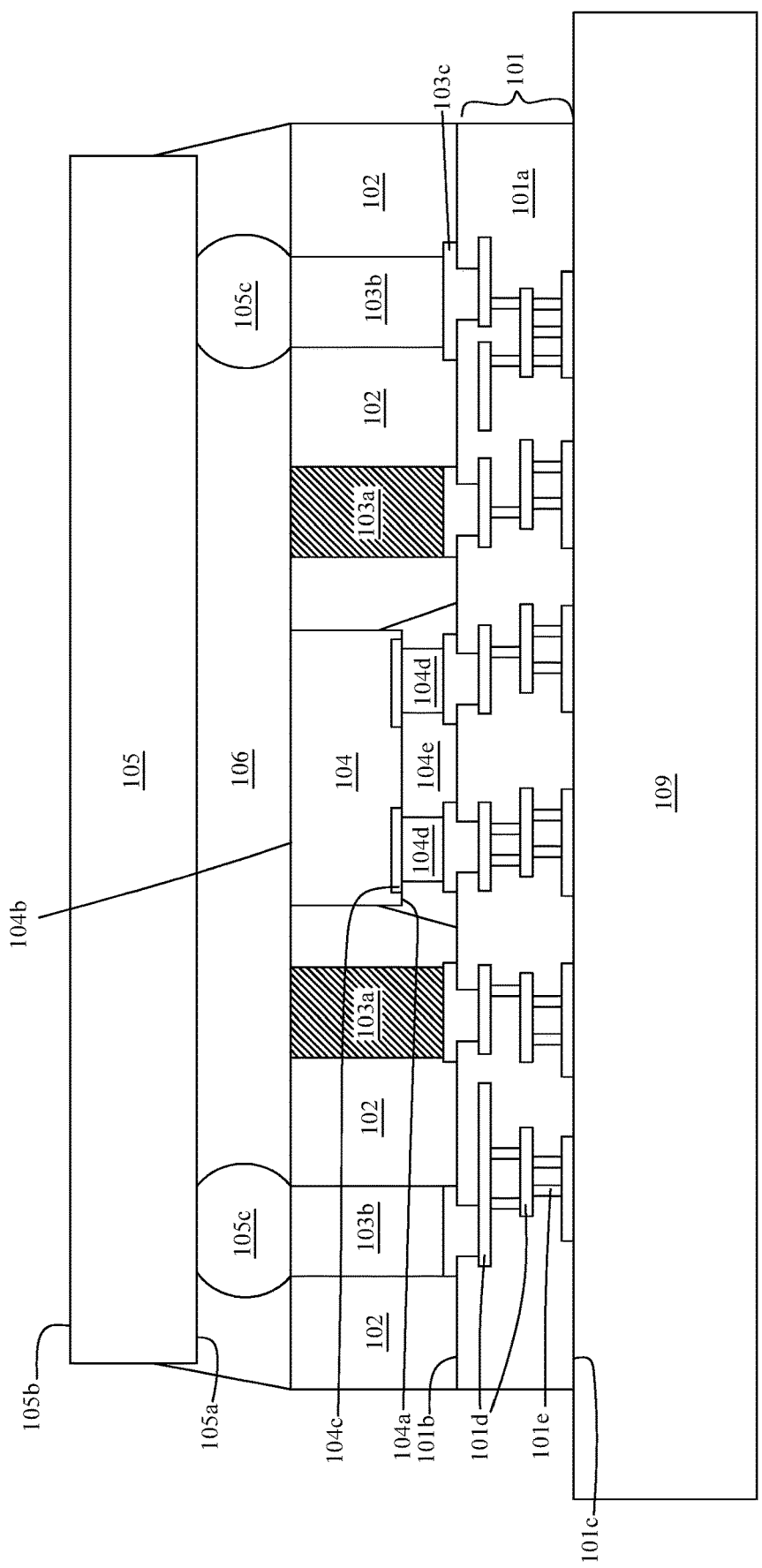

In some embodiments, an second underfill material 106 is disposed between the second die 105 and the molding 102 as shown in FIG. 9H. In some embodiments, the second underfill material 106 is disposed over the first die 104, the first conductive member 103 and the second conductive member 103b. In some embodiments, the second die 105 is partially surrounded by the second underfill material 106. In some embodiments, a fourth surface 105b and a sidewall of the second die 105 are in contact with the second underfill material 106. In some embodiments, a third surface 105a of the second die 105 is exposed from the second underfill material 106. In some embodiments, a portion of the second underfill material 106 is in contact with the first conductive member 103a. In some embodiments, the first conductive member 103a is covered by the second underfill material 106. In some embodiments, the second underfill material 106 is disposed by injection, flowing or any other suitable operations. In some embodiments, the second underfill material 106 has similar configuration as the one described above or illustrated in FIG. 1 or 3.

Figure 9I:
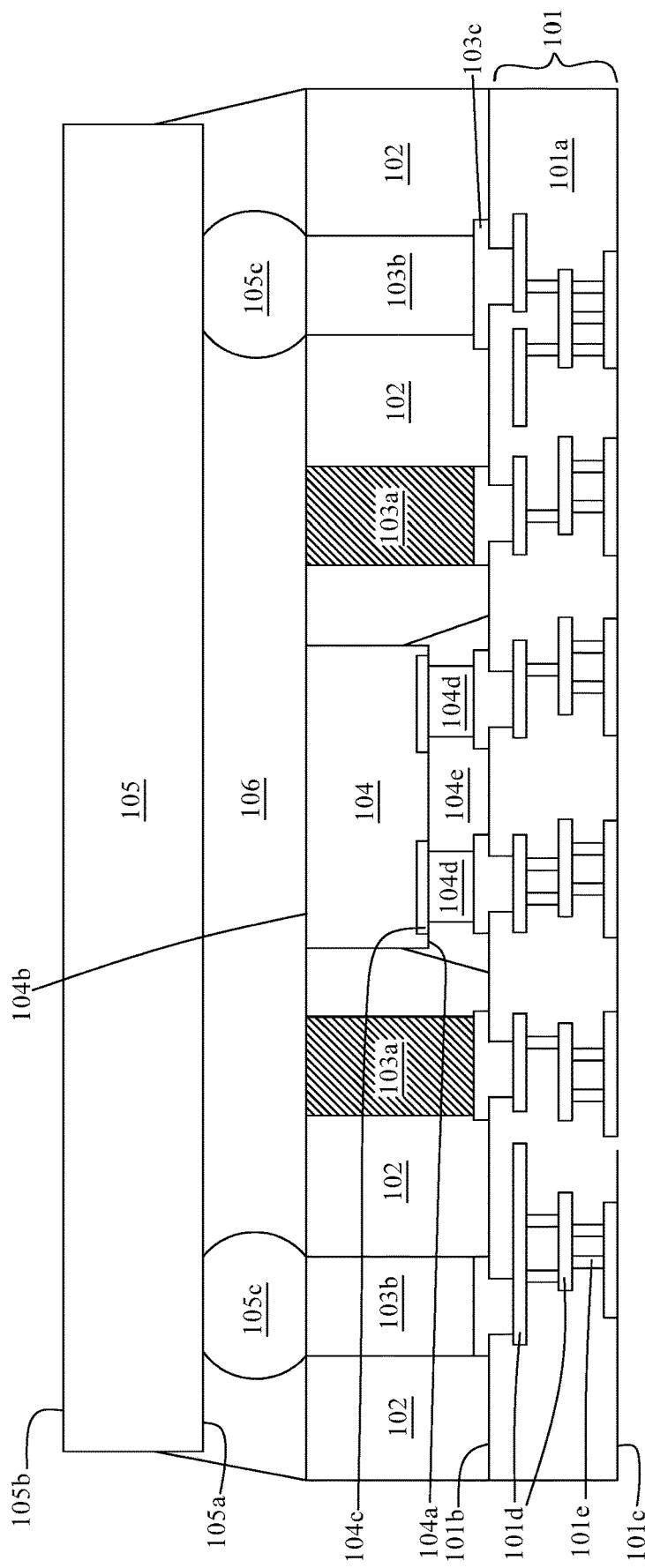

In some embodiments, the carrier 109 is removed as shown in FIG. 9I. In some embodiments, the carrier 109 is removed after the disposing of the second die 105 or the disposing of the second underfill material 106. In some embodiments, the carrier 109 is debonded from the RDL 101 or the dielectric layer 101a.

Figure 9J:
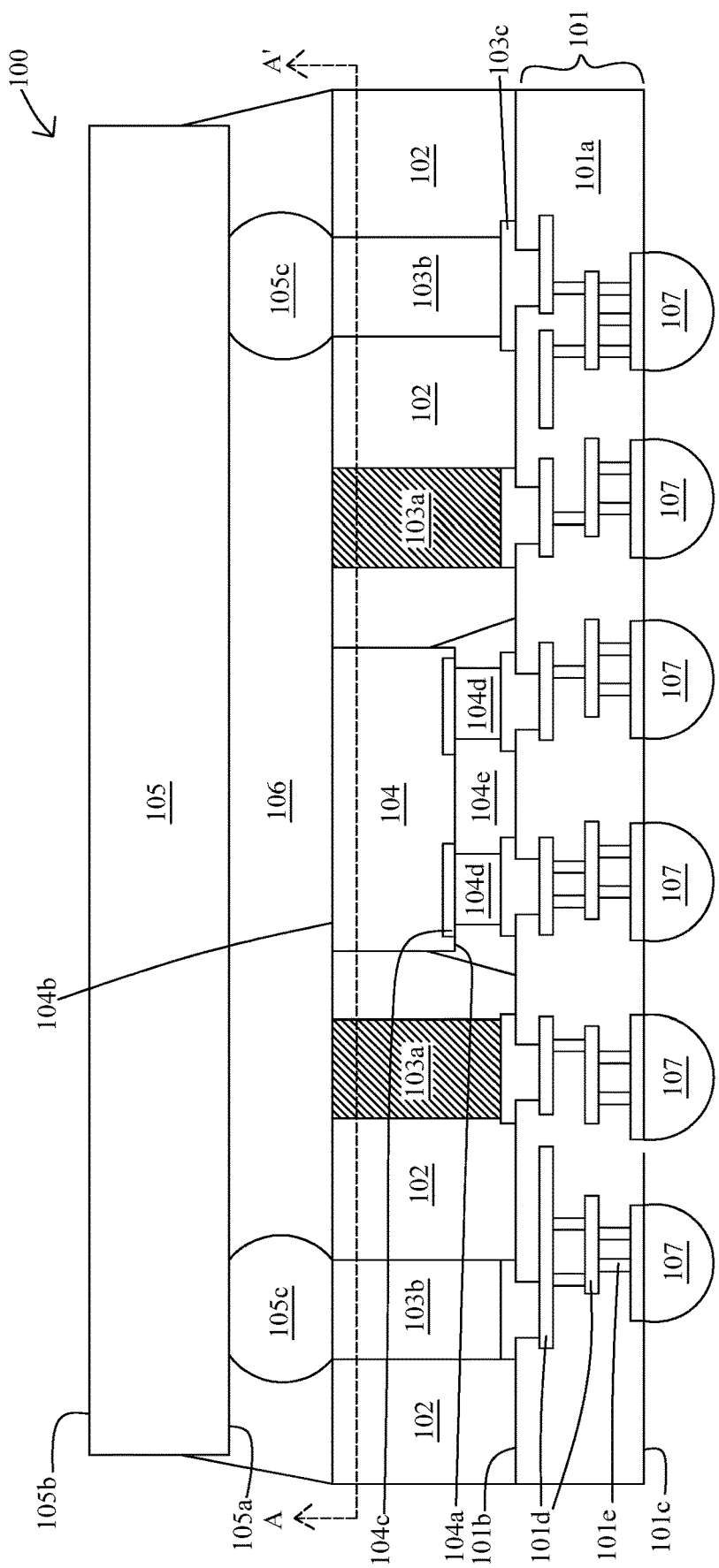

In some embodiments, a conductive bump 107 is disposed over the RDL 101 as shown in FIG. 9J. In some embodiments, the first electrical test (the operation 503) and the second electrical test (the operation 505) are performed prior to the disposing of the conductive bump 107. In some embodiments, the conductive bump 107 is disposed over a second side 101c of the RDL 101. In some embodiments, the conductive bump 107 is disposed over the land portion 101d. In some embodiments, the conductive bump 107 is electrically connected to the conductive trace (101d, 101e), the first die 104, the first conductive member 103a, the second conductive member 103b, the third conductive member 103c or the second die 105. In some embodiments, the conductive bump 107 is disposed by ball dropping, solder pasting, stencil printing or other suitable operations. In some embodiments, the conductive bump 107 has similar configuration as the one described above or illustrated in FIG. 1 or 3. In some embodiments, a semiconductor structure 100 is formed which has similar configuration as the one in FIG. 1.

Figure 10:
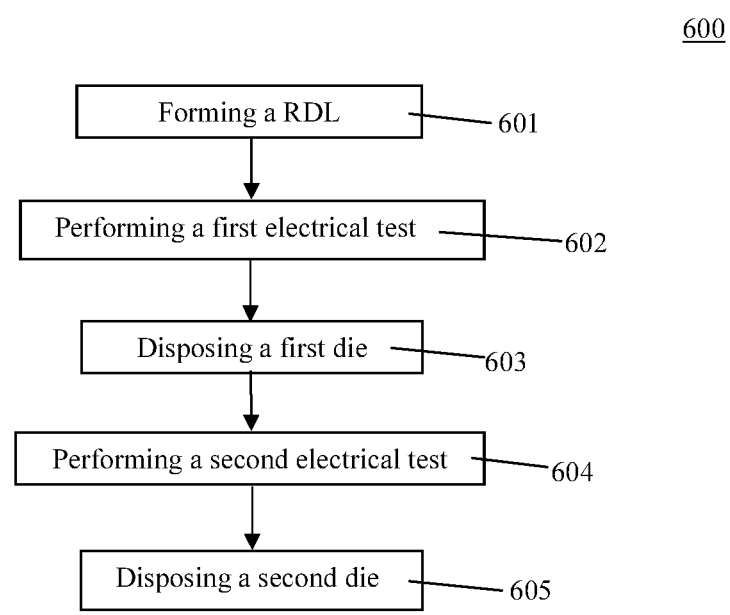
FIG. 10 is a flow diagram of a method of manufacturing a semiconductor structure in accordance with some embodiments of the present disclosure.

In the present disclosure, a method of manufacturing a semiconductor structure (200, 300, 400) is also disclosed. In some embodiments, a semiconductor structure (200, 300, 400) is formed by a method 600. The method 600 includes a number of operations and the description and illustration are not deemed as a limitation as the sequence of the operations. FIG. 10 is an embodiment of the method 600 of manufacturing the semiconductor structure (200, 300, 400). The method 600 includes a number of operations (601, 602, 603, 604, 605).

Figure 10A:
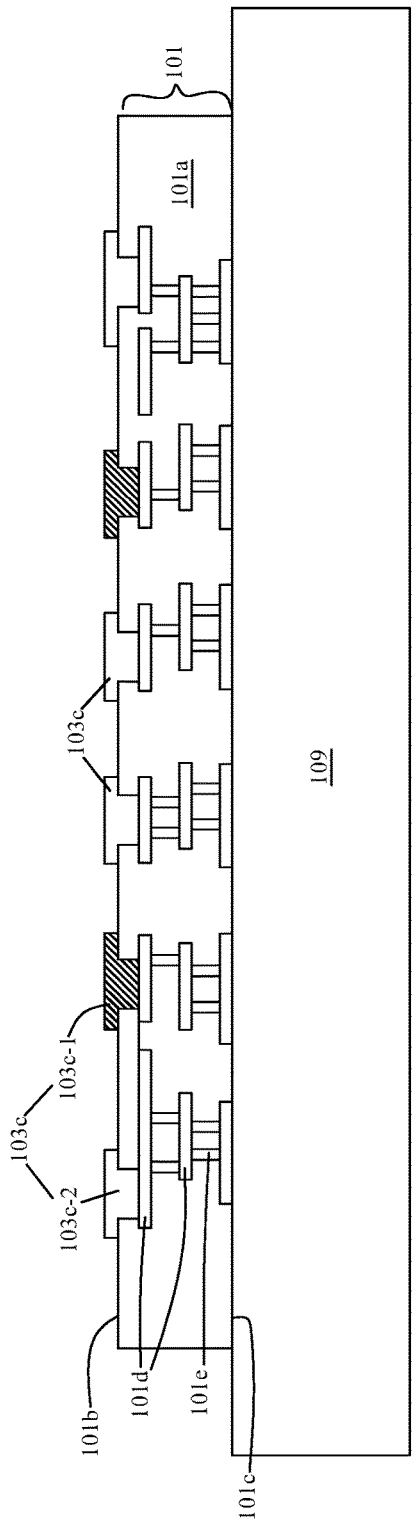
FIGS. 10A-10H are schematic views of manufacturing a semiconductor structure by a method of FIG. 10 in accordance with some embodiments of the present disclosure.

In operation 601, a RDL 101 is formed as shown in FIG. 10A. In some embodiments, a third conductive member (103c-1, 103c-2) is formed over a dielectric layer 101a of the RDL 101. In some embodiments, the third conductive member (103c-1, 103c-2) is a conductive pad disposed over the RDL 101. In some embodiments, the operation 601 is similar to the operation 501 as shown in FIG. 9A.

Figure 10B:
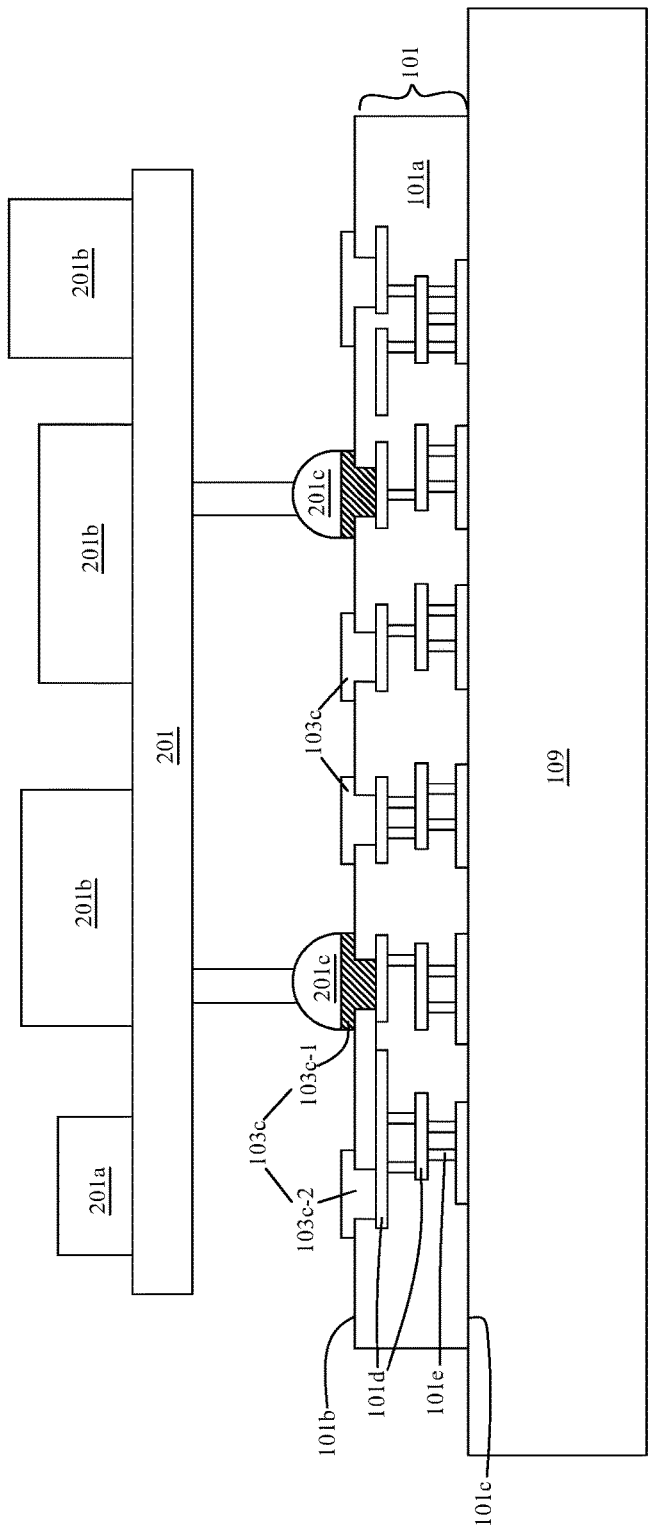

In operation 602, a first electrical test is performed as shown in FIG. 10B. In some embodiments, the first electrical test is performed through the third conductive member 103c-1. In some embodiments, the third conductive member 103c-1 is a dummy conductive member for testing. In some embodiments, the third conductive member (103c-1, 103c-2) is exposed from the RDL 101 upon the performance of the first electrical test. In some embodiments, the first electrical test is configured to test an interconnection of the conductive trace (101d, 101e) in the RDL 101 or identify a failure of the conductive trace (101d, 101e) in the RDL 101 and problematic RDL 101 such as poor electrical interconnection, short circuit, crack, delamination, etc. As such, problematic RDL 101 or conductive trace (101d, 101e) can be identified immediately after the formation of the third conductive member (103c-1, 103c-2).

In some embodiments, the first electrical test is performed by electrically connecting a probe card 201 to the conductive trace (101d, 101e) in the RDL 101 through the third conductive member 103c-1. In some embodiments, the probe card 201 is electrically connected to the third conductive member 103c-1 through a probe card terminal 201c. In some embodiments, the probe card 201 includes a power supply 201a and is embedded with a chip 201b or a functional circuitry such as a memory, a dynamic random access memory (DRAM), a flash memory, a NAND flash memory or a serial peripheral interface (SPI) memory.

Figure 10C:
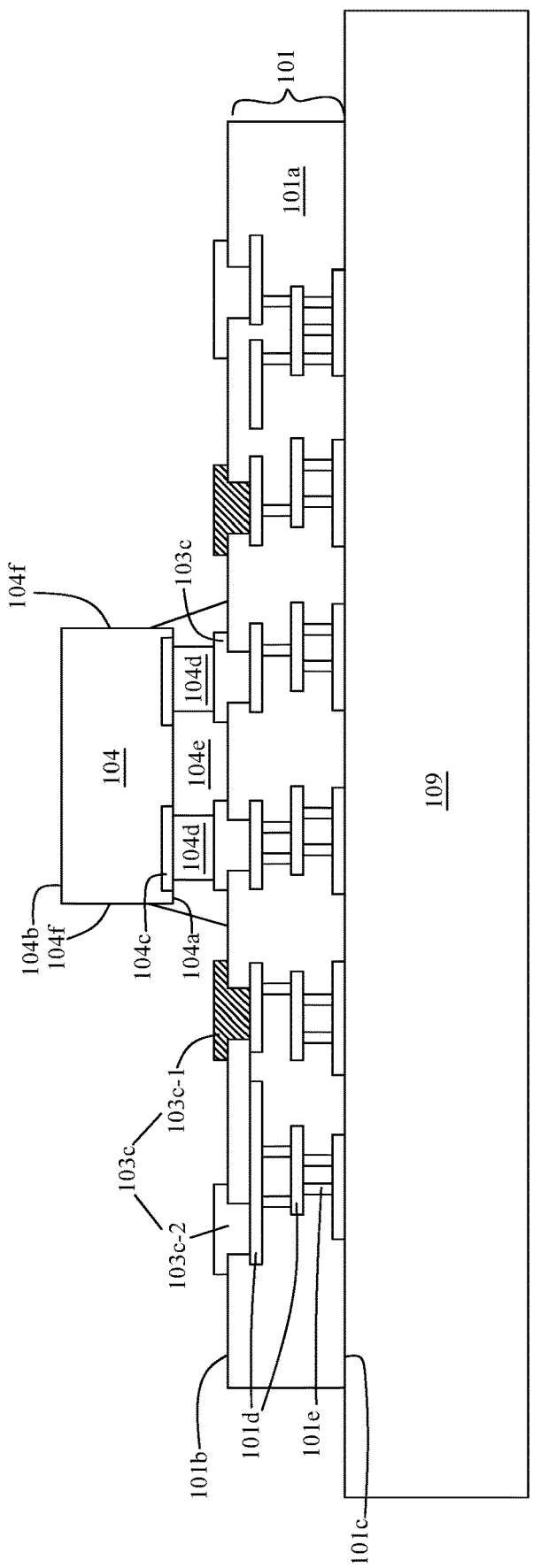

In operation 603, a first die 104 is disposed over the RDL 101 as shown in FIG. 10C. In some embodiments, the operation 603 is similar to the operation 504 as shown in FIG. 9D.

Figure 10D:
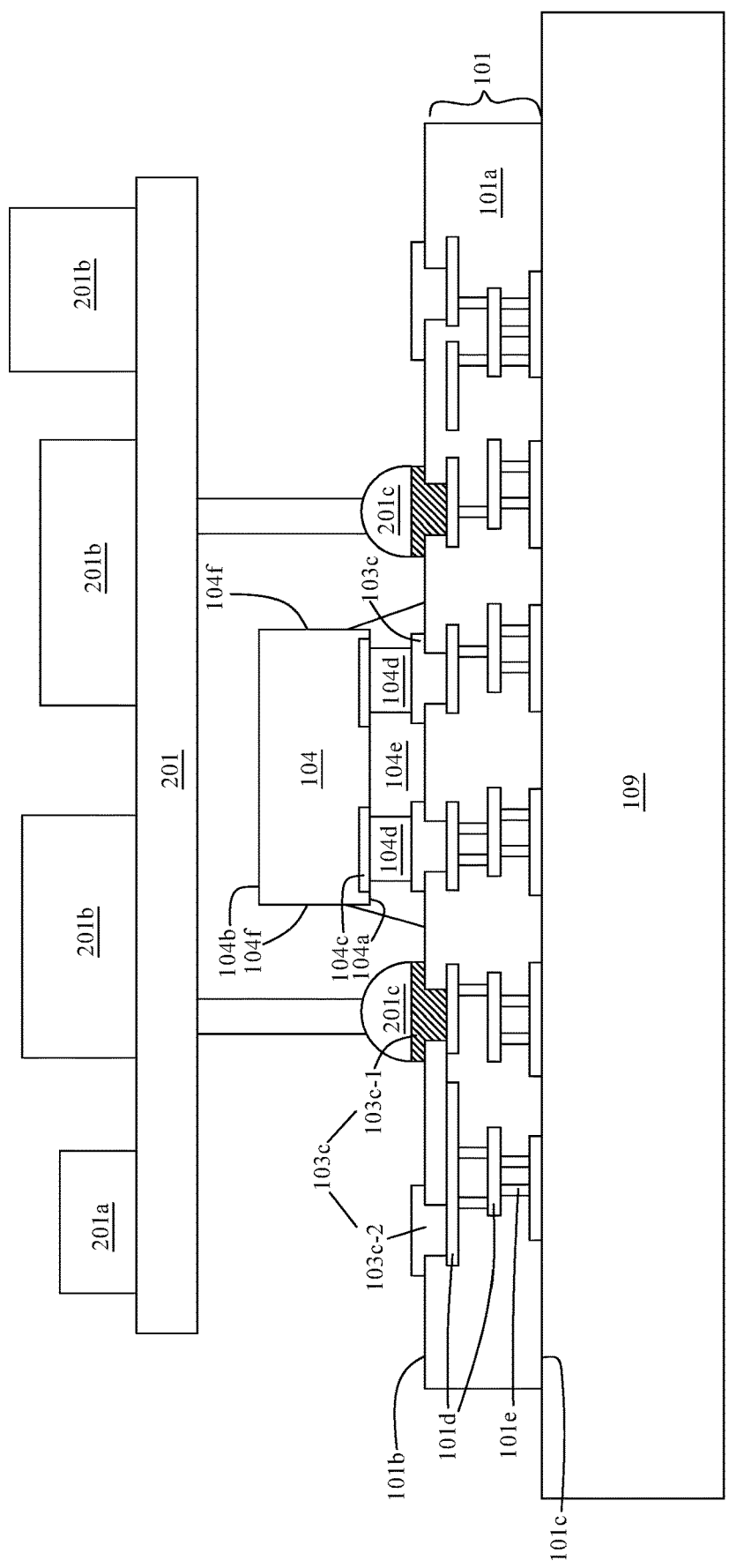
Figure 10E:
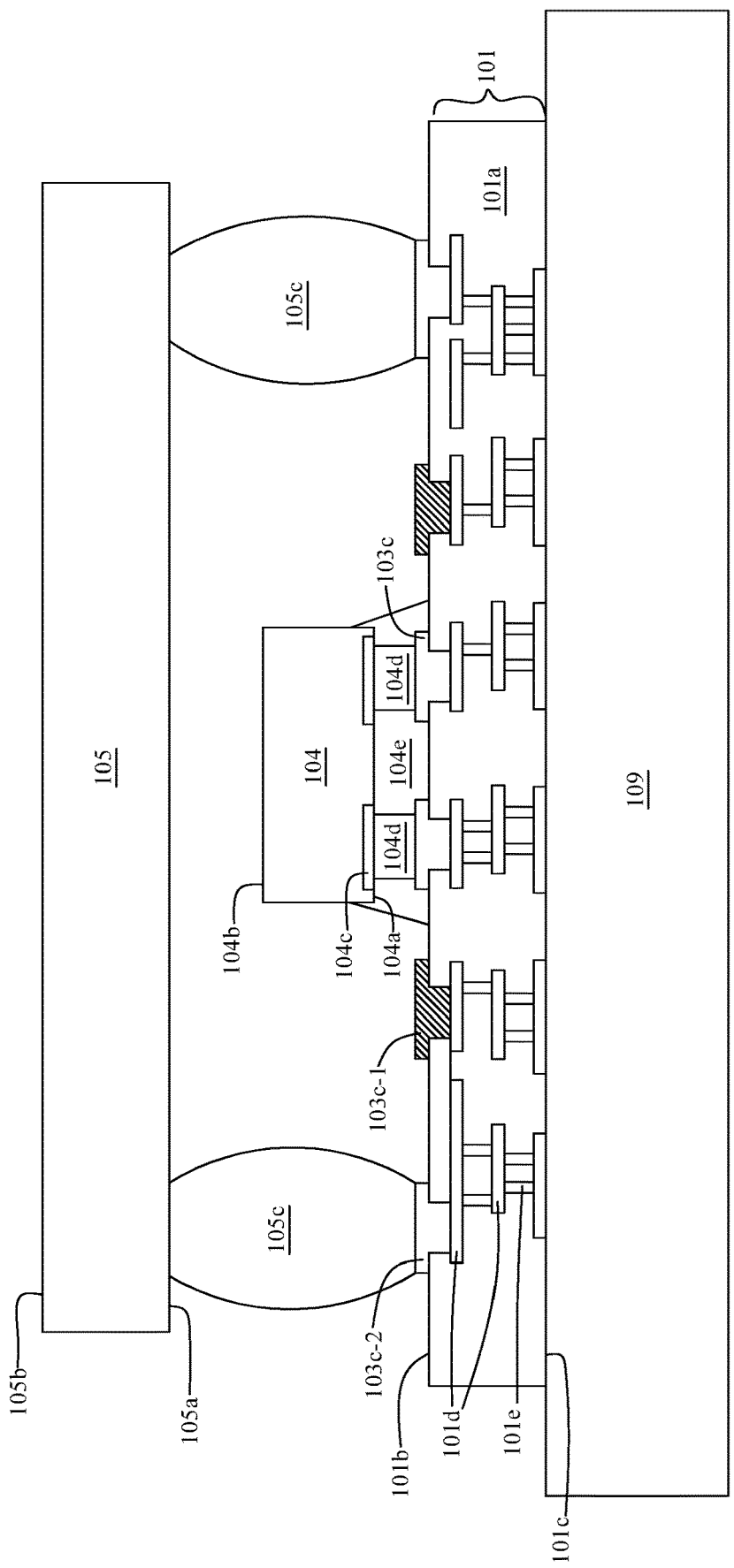

In operation 604, a second electrical test is performed as shown in FIG. 10D. In some embodiments, the second electrical test is performed through the third conductive member 103c-1. In some embodiments, the third conductive member (103c-1, 103c-2) is exposed from the RDL 101 upon the performance of the second electrical test. In some embodiments, the first die 104 is exposed upon the performance of the second electrical test. In some embodiments, a first surface 104a, a second surface 104b or a sidewall 104f of the first die 104 is exposed to the ambient environment upon the performance of the second electrical test. In some embodiments, the second surface 104b and the sidewall 104f of the first die 104 are exposed to the ambient environment upon the performance of the second electrical test. In some embodiments, the second electrical test is configured to test the first die 104 or identify problematic first die 104 such as failure of the first die 104, poor electrical interconnection in the first die 104, short circuit in the first die 104, etc. As such, problematic first die 104 can be identified immediately after the disposing of the first die 104.

In some embodiments, the second electrical test is performed by electrically connecting the probe card 201 to the first die 104 through the third conductive member 103c-1. In some embodiments, the probe card 201 is electrically connected to the first die 104 through a probe card terminal 201c. In some embodiments, the probe card 201 includes the power supply 201a and is embedded with the chip 201b or a functional circuitry such as a memory, a dynamic random access memory (DRAM), a flash memory, a NAND flash memory or a serial peripheral interface (SPI) memory.

In operation 605, a second die 105 is disposed as shown in FIG. 0E. In some embodiments, the second die 105 is disposed over the third conductive member 103c-2. In some embodiments, the second electrical test (the operation 604) is performed prior to the disposing of the second die 105. In some embodiments, the second die 105 includes a second connector 105c disposed over the third conductive member 103c-2. In some embodiments, the second connector 105c is electrically connected to the third conductive member 103c-2. In some embodiments, the second die 105 is electrically connected to the conductive trace (101d, 101e) through the second connector 105c and the third conductive member 103c-2. In some embodiments, the second connector 105c is only disposed over or electrically connected to the third conductive member 103c-2. In some embodiments, the third conductive member 103c-1 is electrically isolated from the second die 105 or the second connector 105c. In some embodiments, the third conductive member 103c-1 is isolated from the second die 105 or the second connector 105c.

In some embodiments, the second connector 105c disposed over the third conductive member 103c-1 is absent.

Figure 10F:
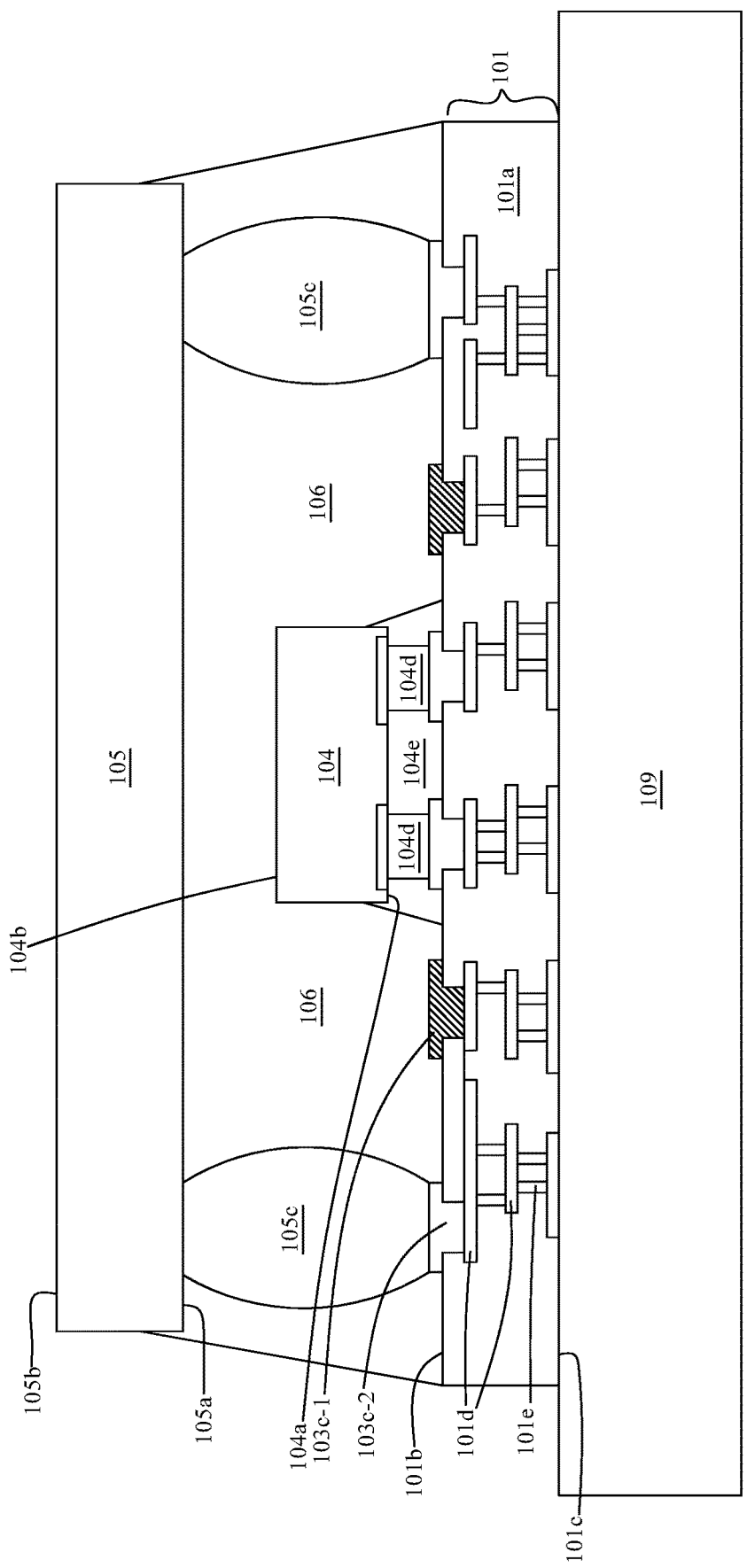

In some embodiments, an second underfill material 106 is disposed between the second die 105 and the molding 102 as shown in FIG. 10F. In some embodiments, the second underfill material 106 is disposed between the second die 105 and the RDL 101. In some embodiments, the second underfill material 106 surrounds the second connector 105c and the first die 104. In some embodiments, the second die 105 is partially surrounded by the second underfill material 106. In some embodiments, the second underfill material 106 is in contact with a fourth surface 105b of the second die 105, a sidewall of the second die 105, the first surface 104a of the first die 104, the second surface 104b of the first die 104 and the sidewall 104f of the first die 104. In some embodiments, the third conductive member 103c is covered or surrounded by the second underfill material 106. In some embodiments, the second underfill material 106 has similar configuration as the one described above or illustrated in FIG. 2 or 4.

Figure 10G:
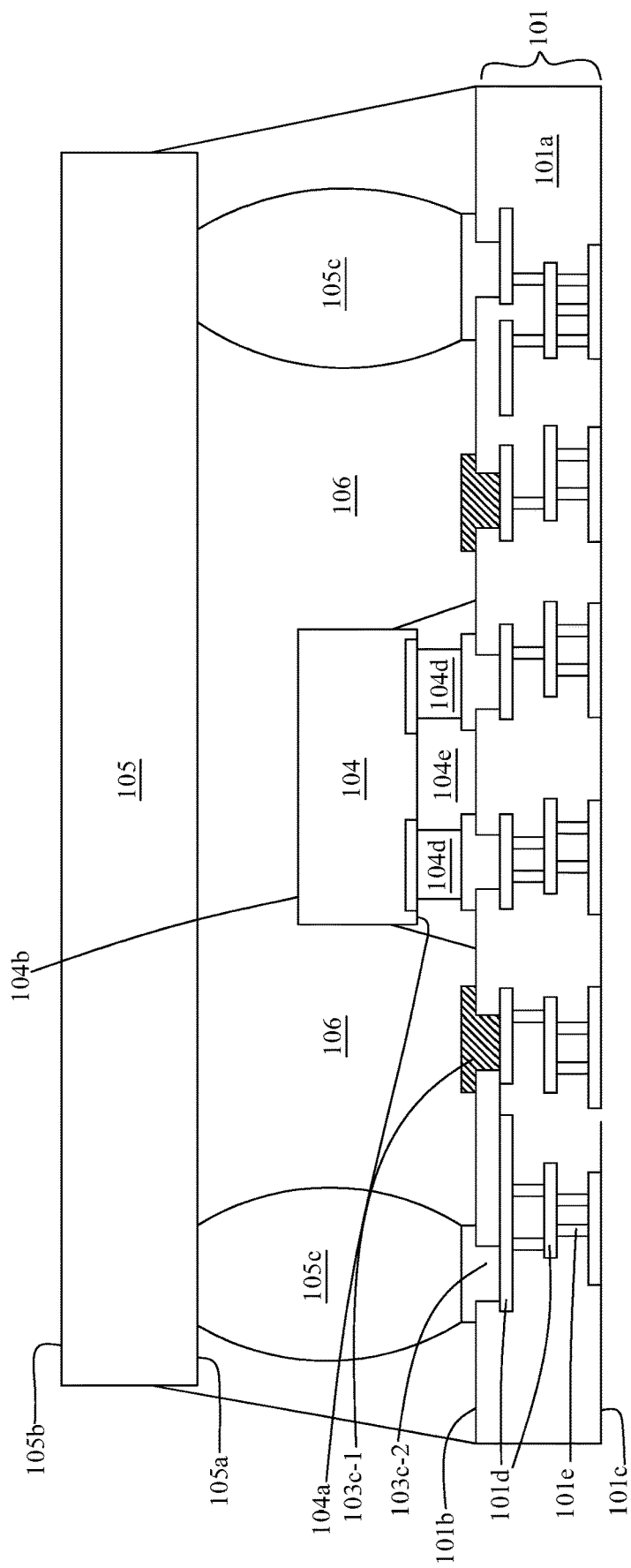

In some embodiments, the carrier 109 is removed as shown in FIG. 10G. In some embodiments, the carrier 109 is removed after the disposing of the second die 105 or the disposing of the second underfill material 106. In some embodiments, the carrier 109 is debonded from the RDL 101 or the dielectric layer 101a.

Figure 10H:
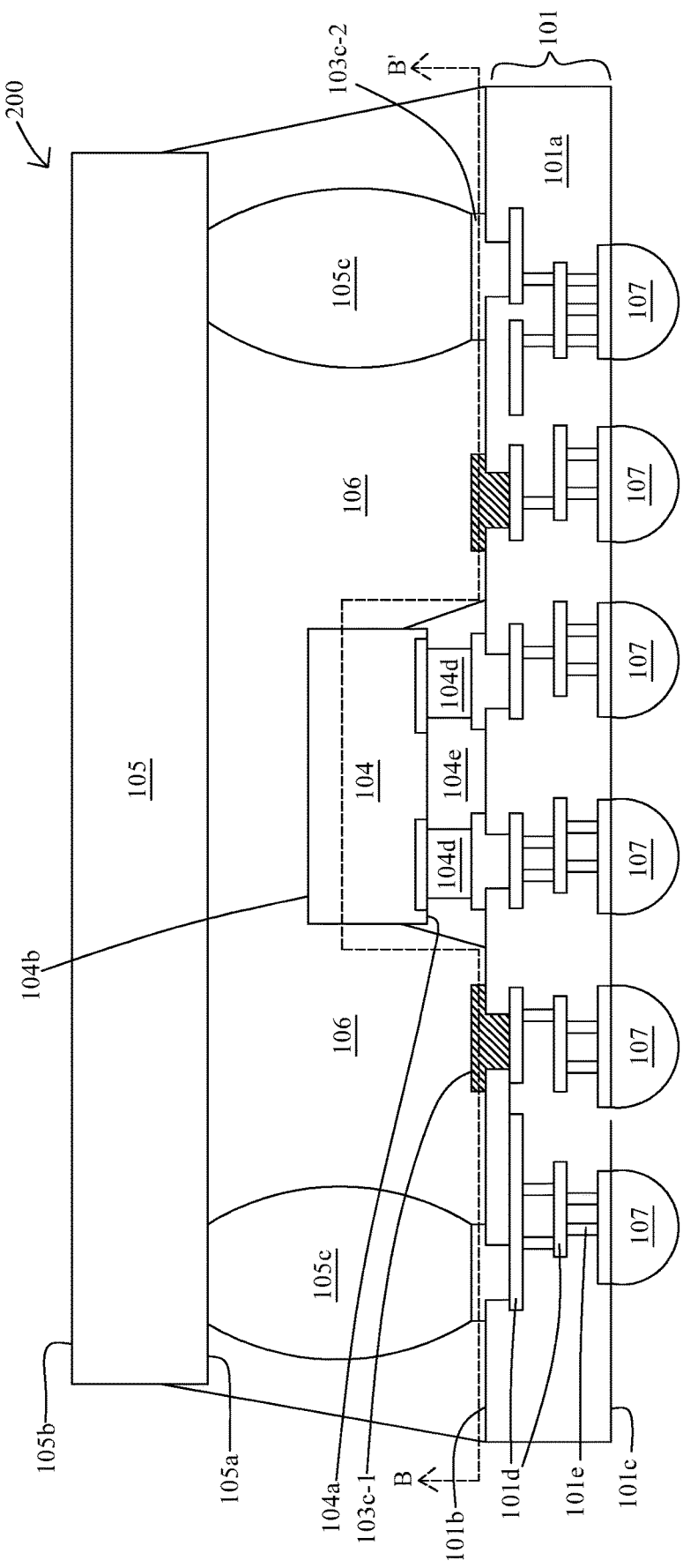

In some embodiments, a conductive bump 107 is disposed over the RDL 101 as shown in FIG. 10H. In some embodiments, the first electrical test (the operation 602) and the second electrical test (the operation 604) are performed prior to the disposing of the conductive bump 107. In some embodiments, the conductive bump 107 is disposed over a second side 101c of the RDL 101. In some embodiments, the conductive bump 107 is disposed over the land portion 101d. In some embodiments, the conductive bump 107 is electrically connected to the conductive trace (10d, 101e), the first die 104, the third conductive member 103c or the second die 105. In some embodiments, the conductive bump 107 is disposed by ball dropping, solder pasting, stencil printing or other suitable operations. In some embodiments, the conductive bump 107 has similar configuration as the one described above or illustrated in FIG. 2 or 4. In some embodiments, a semiconductor structure 200 is formed which has similar configuration as the one in FIG. 2.

In the present disclosure, a semiconductor structure is disclosed. The semiconductor structure includes a dummy conductive member for electrical testing during the manufacturing of the semiconductor structure. A die or an electrical interconnection in the semiconductor structure can be tested through the dummy conductive member during the manufacturing. As such, failure of die or problematic electrical interconnection can be identified before the completion of the semiconductor structure. Therefore, wastage of material can be minimized and a yield of the semiconductor structure can be increased or improved.

In some embodiments, a method of manufacturing a semiconductor structure includes forming a redistribution layer (RDL); forming a conductive pad over the RDL; performing a first electrical test through the conductive pad; bonding a first die over the RDL by a connector; disposing a first underfill material to surround the connector; performing a second electrical test through the conductive pad; disposing a second die over the first die and the conductive pad; and disposing a second underfill material to surround the second die, wherein the conductive pad is at least partially in contact with the second underfill material, and is protruded from the RDL during the first electrical test and the second electrical test.

In some embodiments, the first electrical test is performed prior to the disposing of the first die and the disposing of the second die. In some embodiments, the second electrical test is performed after the disposing of the first die and prior to the disposing of the second die. In some embodiments, the conductive pad is exposed from the RDL upon the performance of the first electrical test and the performance of the second electrical test. In some embodiments, the conductive pad is exposed from the RDL after the disposing of the second die and prior to the disposing of the second underfill material. In some embodiments, the conductive pad is electrically connected to the first die. In some embodiments, the conductive pad is electrically isolated from the second die. In some embodiments, the first electrical test and the second electrical test are performed through a surface of the conductive pad, and the surface is in contact with the second underfill material.

In some embodiments, a method of manufacturing a semiconductor structure includes forming a redistribution layer (RDL); forming a first conductive pad over the RDL; forming a second conductive pad over the RDL; performing a first electrical test through the first conductive pad; bonding a first die over the first RDL by a first connector; disposing a first underfill material to surround the first connector; performing a second electrical test through the first conductive pad; and bonding a second die over the first die and the RDL by a second connector; wherein the first conductive pad is electrically isolated from the second die, the second conductive pad is electrically connect the second die, the first conductive pad and the second conductive pad are protruded from the RDL during the first electrical test and the second electrical test.

In some embodiments, the first electrical test includes electrically connecting a probe card to the RDL through the first conductive pad. In some embodiments, the second electrical test includes electrically connecting the probe card to the first die through the first conductive pad. In some embodiments, the first conductive pad is exposed from the RDL after the disposing of the second die. In some embodiments, the second conductive pad is covered by the second connector after the disposing of the second die. In some embodiments, the method further includes disposing a second underfill material to surround the second connector. In some embodiments, the second conductive pad is in contact with the second connector and the second underfill material. In some embodiments, the first die and the first underfill material are surrounded by the second underfill material. In some embodiments, the first conductive pad and the second conductive pad are formed separately or simultaneously.

In some embodiments, a method of manufacturing a semiconductor structure includes forming a redistribution layer (RDL); forming a first conductive pad over the RDL; forming a second conductive pad over the RDL; performing a first electrical test through the first conductive pad; bonding a first die over the RDL by a first connector; disposing a first underfill material to surround the first connector; performing a second electrical test through the first conductive pad; bonding a second die over the first die and the RDL by a second connector; and disposing a second underfill material to surround the second die, wherein a top surface of the first conductive pad is in contact with the second underfill material, and a top surface of the second conductive pad is in contact with the second connector.

In some embodiments, the first electrical test and the second electrical test are performed through the top surface of the first conductive pad. In some embodiments, the top surface of the first conductive pad is substantially coplanar with the top surface of the second conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a semiconductor structure, comprising:
   forming a redistribution layer (RDL);
   forming a conductive pad over the RDL;
   performing a first electrical test through the conductive pad;
   bonding a first die over the RDL by a connector;
   disposing a first underfill material to surround the connector;
   performing a second electrical test through the conductive pad;
   disposing a second die over the first die and the conductive pad; and
   disposing a second underfill material to surround the second die,
   wherein the conductive pad is at least partially in contact with the second underfill material, and is protruded from the RDL during the first electrical test and the second electrical test.

2. The method of claim 1, wherein the first electrical test is performed prior to the disposing of the first die and the disposing of the second die.

3. The method of claim 1, wherein the second electrical test is performed after the disposing of the first die and prior to the disposing of the second die.

4. The method of claim 1, wherein the conductive pad is exposed from the RDL upon the performance of the first electrical test and the performance of the second electrical test.

5. The method of claim 1, wherein the conductive pad is exposed from the RDL after the disposing of the second die and prior to the disposing of the second underfill material.

6. The method of claim 1, wherein the conductive pad is electrically connected to the first die.

7. The method of claim 1, wherein the conductive pad is electrically isolated from the second die.

8. The method of claim 1, wherein the first electrical test and the second electrical test are performed through a surface of the conductive pad, and the surface is in contact with the second underfill material.

9. A method of manufacturing a semiconductor structure, comprising:
   forming a redistribution layer (RDL);
   forming a first conductive pad over the RDL;
   forming a second conductive pad over the RDL;
   performing a first electrical test through the first conductive pad;
   bonding a first die over the first RDL by a first connector;
   disposing a first underfill material to surround the first connector;
   performing a second electrical test through the first conductive pad; and
   bonding a second die over the first die and the RDL by a second connector;
   wherein the first conductive pad is electrically isolated from the second die, the second conductive pad is electrically connect the second die, the first conductive pad and the second conductive pad are protruded from the RDL during the first electrical test and the second electrical test.

10. The method of claim 9, wherein the first electrical test includes electrically connecting a probe card to the RDL through the first conductive pad.

11. The method of claim 9, wherein the second electrical test includes electrically connecting the probe card to the first die through the first conductive pad.

12. The method of claim 9, wherein the first conductive pad is exposed from the RDL after the disposing of the second die.

13. The method of claim 9, wherein the second conductive pad is covered by the second connector after the disposing of the second die.

14. The method of claim 9, further comprising disposing a second underfill material to surround the second connector.

15. The method of claim 14, wherein the second conductive pad is in contact with the second connector and the second underfill material.

16. The method of claim 14, wherein the first die and the first underfill material are surrounded by the second underfill material.

17. The method of claim 9, wherein the first conductive pad and the second conductive pad are formed separately or simultaneously.

18. A method of manufacturing a semiconductor structure, comprising:
   forming a redistribution layer (RDL);
   forming a first conductive pad over the RDL;
   forming a second conductive pad over the RDL;
   performing a first electrical test through the first conductive pad;
   bonding a first die over the RDL by a first connector;
   disposing a first underfill material to surround the first connector;
   performing a second electrical test through the first conductive pad;
   bonding a second die over the first die and the RDL by a second connector; and
   disposing a second underfill material to surround the second die,
   wherein a top surface of the first conductive pad is in contact with the second underfill material, and a top surface of the second conductive pad is in contact with the second connector.

19. The method of claim 18, wherein the first electrical test and the second electrical test are performed through the top surface of the first conductive pad.

20. The method of claim 18, wherein the top surface of the first conductive pad is substantially coplanar with the top surface of the second conductive pad.

* * * * *